(12) United States Patent
Kirimura et al.

(10) Patent No.: US 8,362,569 B2
(45) Date of Patent: Jan. 29, 2013

(54) SEMICONDUCTOR DEVICE AND SEMICONDUCTOR DEVICE FABRICATION METHOD

(75) Inventors: Tomoyuki Kirimura, Yokohama (JP); Jusuke Ogura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 329 days.

(21) Appl. No.: 12/761,516

(22) Filed: Apr. 16, 2010

(65) Prior Publication Data

US 2010/0270623 A1 Oct. 28, 2010

(30) Foreign Application Priority Data

Apr. 24, 2009 (JP) ................. 2009-106581

(51) Int. Cl.
*H01L 27/092* (2006.01)
*H01L 21/8238* (2006.01)

(52) U.S. Cl. ......... 257/369; 257/E21.641; 257/E27.062; 438/586

(58) Field of Classification Search .................. None
See application file for complete search history.

(56) References Cited

U.S. PATENT DOCUMENTS

| | | | | |
|---|---|---|---|---|
| 7,534,678 B2* | 5/2009 | Lee et al. | ..... | 438/200 |
| 7,642,148 B2* | 1/2010 | Nam et al. | ..... | 438/200 |
| 7,759,185 B2* | 7/2010 | Nam et al. | ..... | 438/199 |
| 7,800,134 B2* | 9/2010 | Lee et al. | ..... | 257/202 |
| 2007/0205467 A1* | 9/2007 | Morioka et al. | ..... | 257/371 |
| 2008/0050869 A1* | 2/2008 | Sudo | ..... | 438/228 |
| 2008/0242015 A1* | 10/2008 | Lee et al. | ..... | 438/200 |
| 2009/0017630 A1* | 1/2009 | Lee et al. | ..... | 438/702 |
| 2010/0065919 A1* | 3/2010 | Nam et al. | ..... | 257/369 |
| 2011/0163387 A1* | 7/2011 | Lee et al. | ..... | 257/369 |

FOREIGN PATENT DOCUMENTS

| | | |
|---|---|---|
| JP | 2007-208166 A | 8/2007 |
| JP | 2007-235074 A | 9/2007 |
| JP | 2008-16853 A | 1/2008 |

OTHER PUBLICATIONS van den Hoek, W. G. M.; Wicker, T. E.; Westlund, B. F.; Powell, G. B.; , "Isotropic plasma etching of doped and undoped silicon dioxide for contact holes and vias," Journal of Vacuum Science & Technology A: Vacuum, Surfaces, and Films, vol. 7, No. 3, pp. 670-675, May 1989.*

\* cited by examiner

*Primary Examiner* — Thomas L Dickey
*Assistant Examiner* — Joseph Schoenholtz
(74) *Attorney, Agent, or Firm* — Westerman, Hattori, Daniels & Adrian, LLP

(57) ABSTRACT

A semiconductor device fabrication method including: forming a gate conductor including a gate for a transistor in the first region, and a gate for a transistor in the second region, and a first film over a first stress film for covering the transistors; etching the first film from the second region by using a mask layer and etching the first film under the mask layer in the direction parallel to the surface of the semiconductor substrate by a first width from an edge of the first mask layer, and the first stress film from the second region; forming a second stress film covering the first stress film and the first film; etching the second stress film so that a portion of the second stress film overlaps a portion of the first stress film and a portion of the first film; and forming a contact hole connected with the gate conductor.

13 Claims, 12 Drawing Sheets

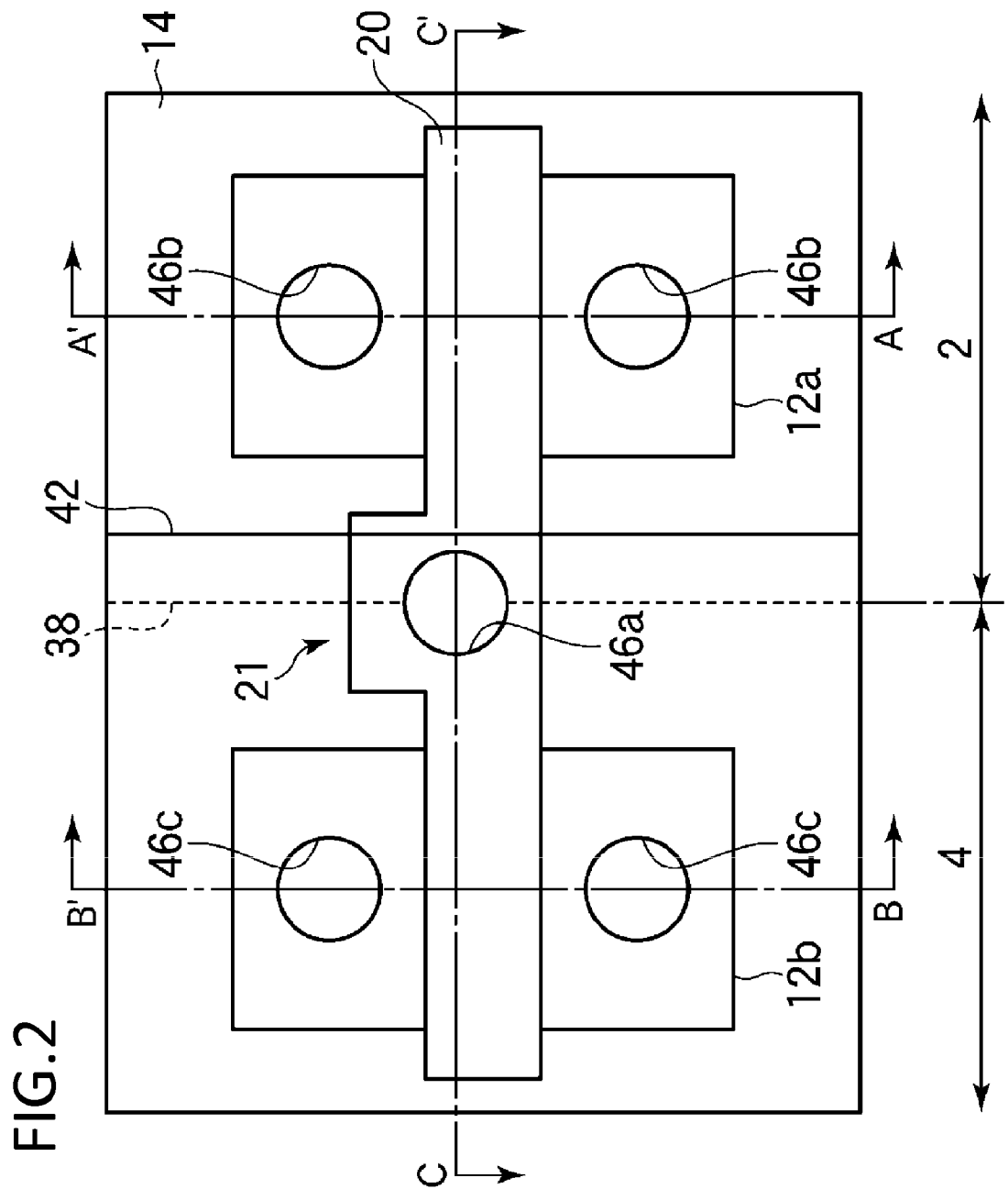

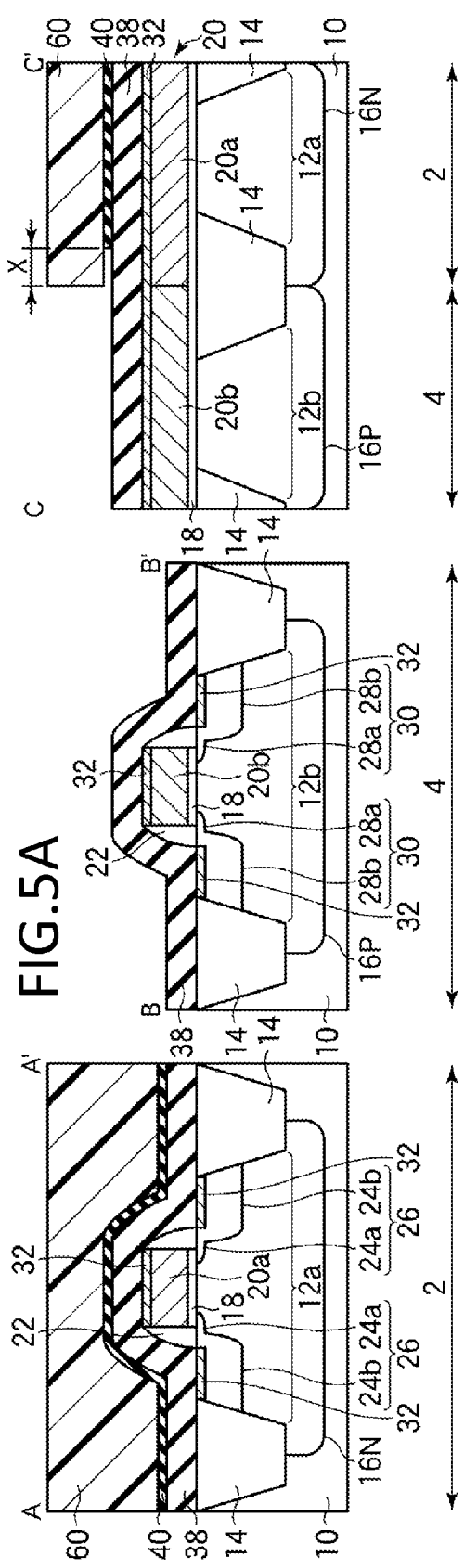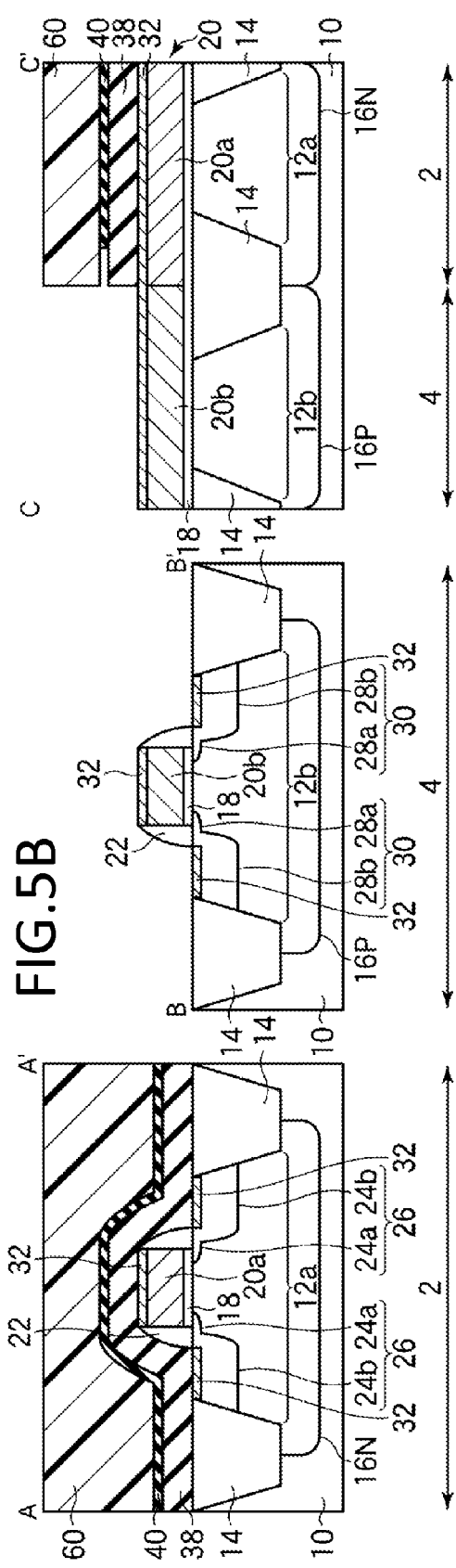

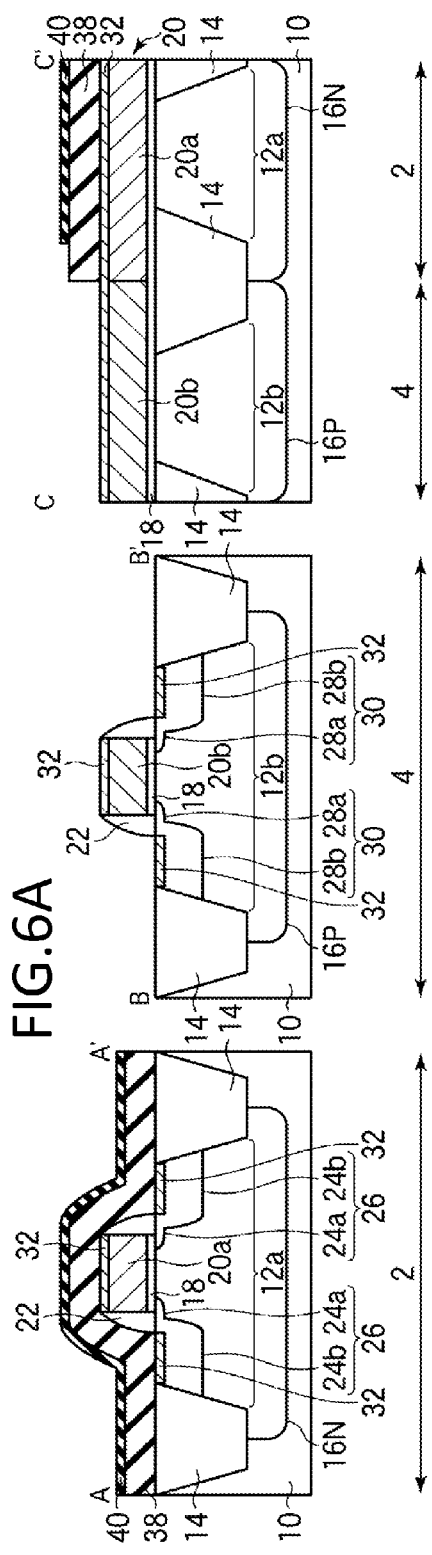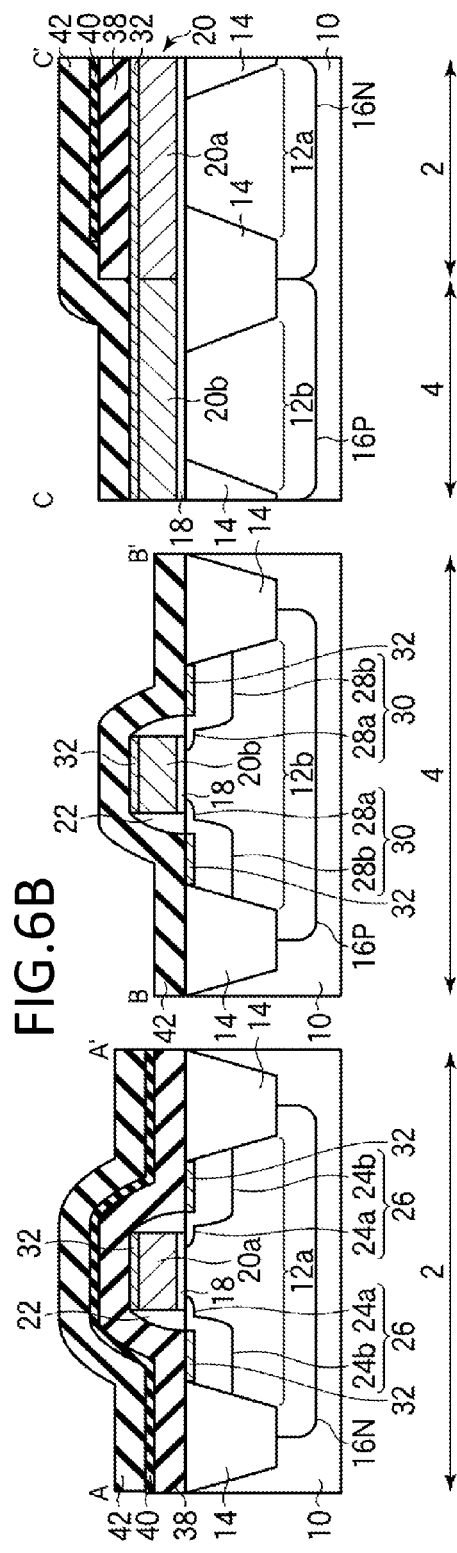

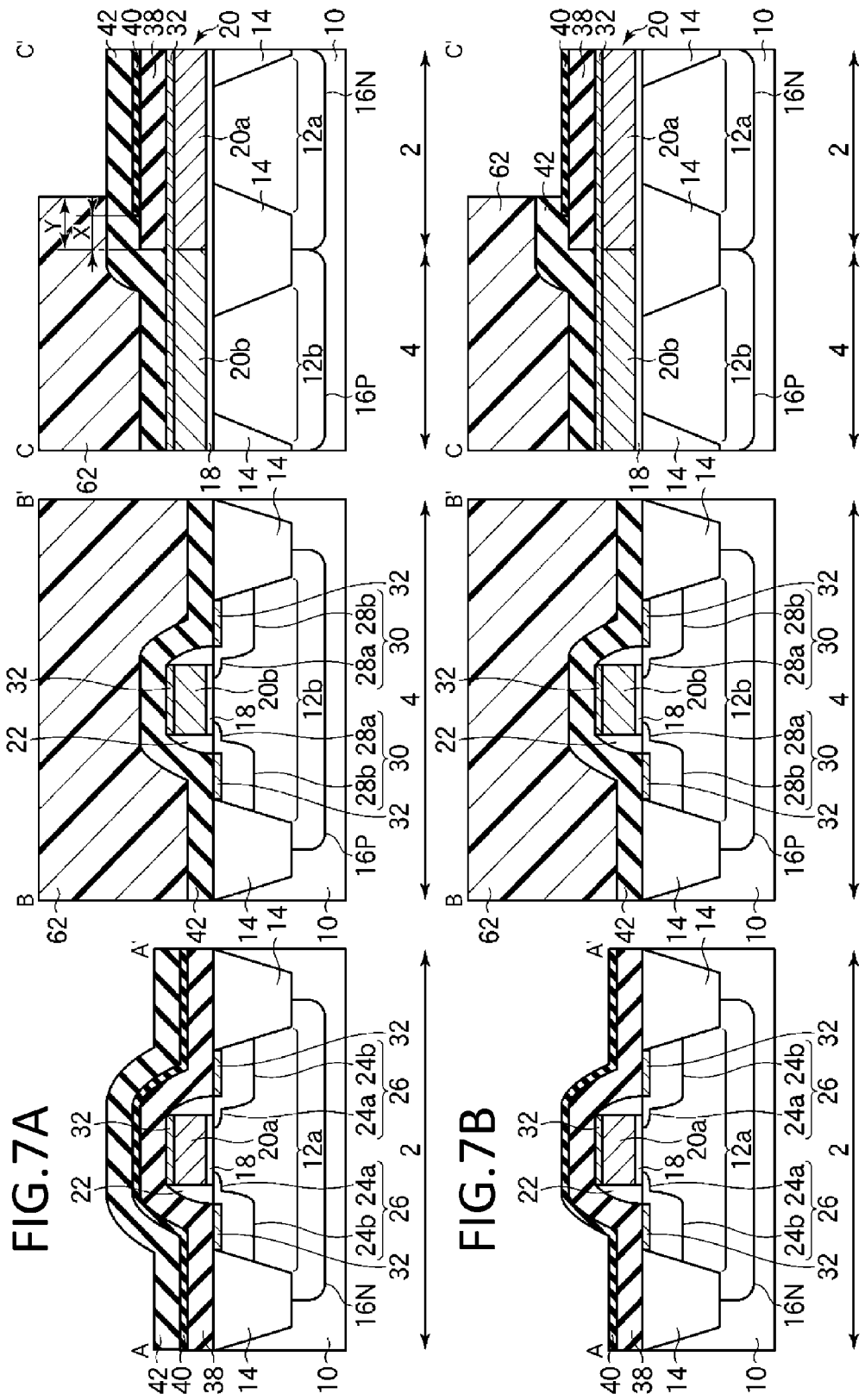

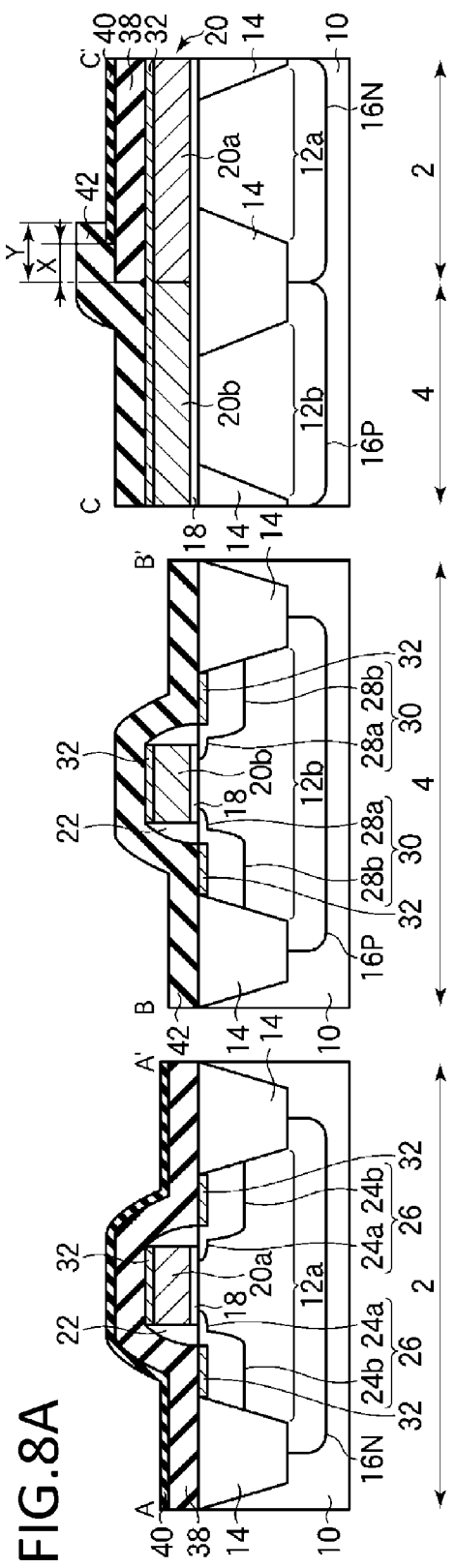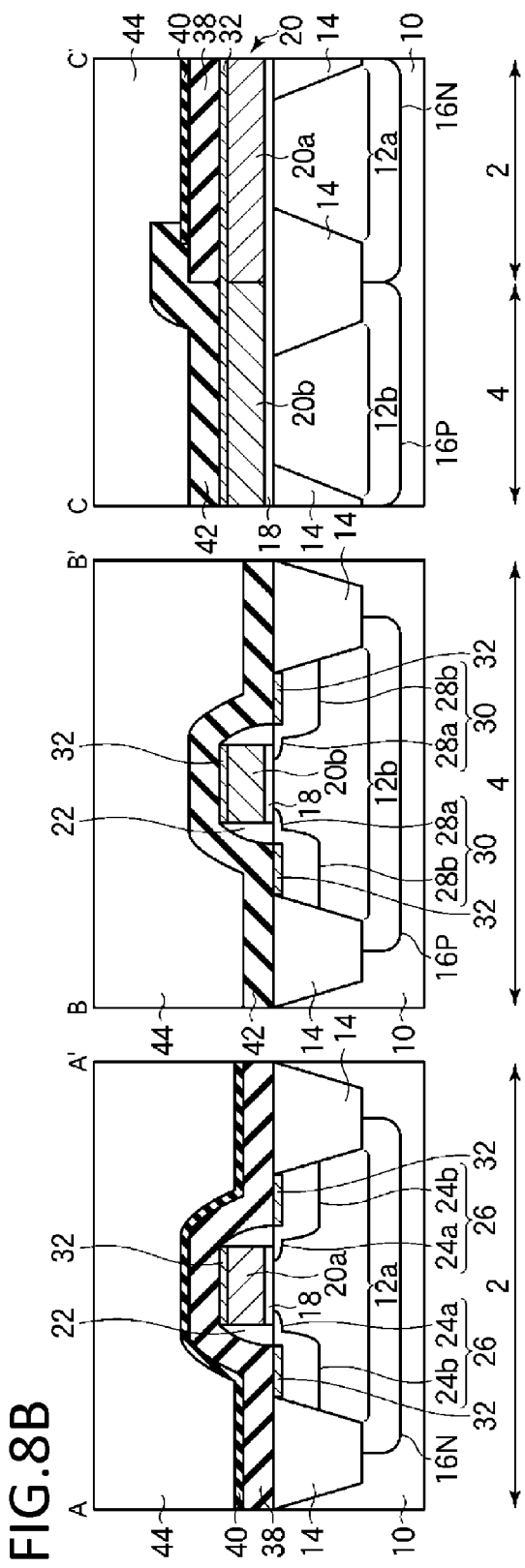

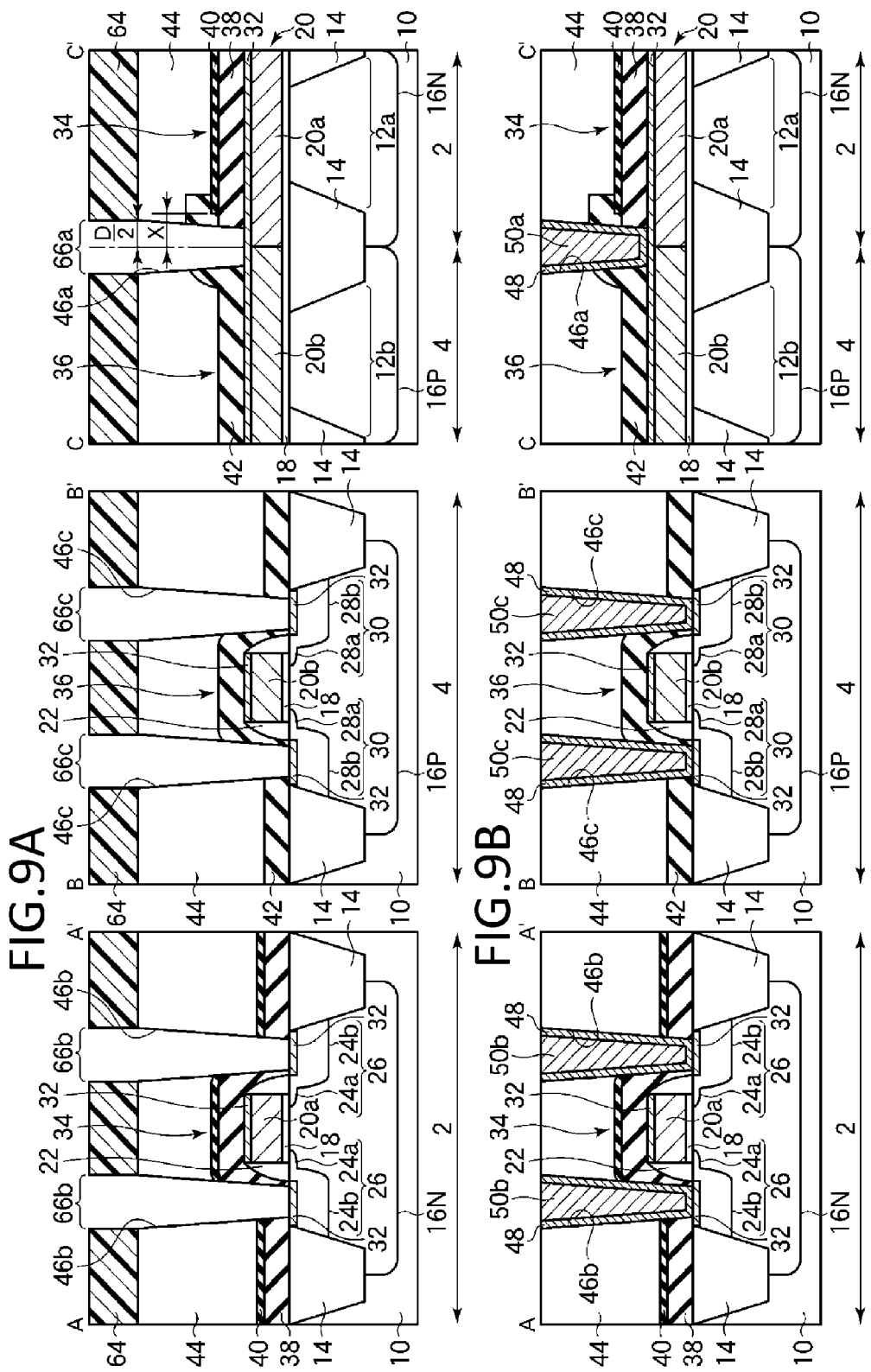

SEMICONDUCTOR DEVICE AND SEMICONDUCTOR DEVICE FABRICATION METHOD

CROSS REFERENCE TO RELATED APPLICATION

This application is based upon and claims the benefit of priority from the prior Japanese Patent Application NO. 2009-106581 filed on Apr. 24, 2009, the entire contents of which are incorporated herein by reference.

FIELD

The embodiments discussed herein are related to a semiconductor device and a method for fabricating the semiconductor device.

BACKGROUND

Semiconductor devices containing CMOS circuits having PMOS and NMOS transistors are capturing attention.

In those semiconductor devices, a gate conductor is formed continuously in a PMOS transistor formation region and an NMOS transistor formation region. The portion of the gate conductor in the PMOS transistor formation region works as the gate electrode of the PMOS transistor; the portion of the gate conductor in the NMOS transistor formation region works as the gate electrode of the NMOS transistor.

Over the semiconductor substrate on which the PMOS and NMOS transistors are formed, an interlayer insulating film is formed to cover the PMOS and NMOS transistors. Contact holes to the gate conductor are formed in the interlayer insulating film and conductor plugs are embedded in the contact holes.

There is a method for improving the carrier mobility in a PMOS transistor by providing an insulating film that covers the PMOS transistor so as to apply a compressive stress to the channel region of the PMOS transistor. In another method for improving the carrier mobility in an NMOS transistor, an insulating film that covers the NMOS transistor is formed so as to apply a tensile stress to the channel region of the NMOS transistor. (See Japanese Laid-Open Patent Publications No. 2007-208166, No. 2008-16853 and No. 2007-235074, for example).

However, when forming contact hole down to the gate conductor passing through the stress insulating films, the hole may not reach the gate conductor because of the stress insulating films. If contact holes do not reach the gate conductor, the connection between the conductor plugs and the gate conductors may not be ensured and a sufficiently high manufacturing yield may not be achieved.

SUMMARY

According to one aspect of the embodiments, there is provided a semiconductor device fabrication method including the steps of: forming a gate conductor continuously in first and second regions of a semiconductor substrate, forming a first transistor including a first gate electrode which is a portion of the gate conductor in the first region, forming a second transistor including a second gate electrode which is another portion of the gate conductor in the second region; forming a first stress film to cover the first and second transistors on the semiconductor substrate; forming on the first stress film a first insulating film having etch characteristics different from those of the first stress film; forming a first mask layer which covers the first region and exposes the second region; etching the first insulating film away from the second region by using the first mask layer as a mask and etching the first insulating film under the first mask layer in the direction parallel to the surface of the semiconductor substrate by a first width from an edge of the first mask layer; etching the first stress film away from the second region by using the first mask layer as a mask; forming a second stress film having etch characteristics different from those of the first insulating film to cover the second transistor, the first stress film and the first insulating film on the semiconductor substrate; forming on the second stress film a second mask layer which covers the second region, an edge of the second mask layer on the first region side being located on the first insulating film; etching the second stress film by using the second mask layer as a mask so that a portion of the second stress film overlaps a portion of the first stress film and a portion of the first insulating film; forming a second insulating film to cover the first stress film, the second stress film and the first insulating film on the semiconductor substrate; forming a contact hole passing through the second insulating film, the second stress film, and the first stress film down to the gate conductor at the boundary between the first region and the second region; and embedding a conductor plug in the contact hole.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF THE DRAWINGS

FIG. 2 is a plan view of the semiconductor device according to the embodiment;

FIG. 5A and FIG. 5B provide process cross-sectional views of the semiconductor device, further illustrating the semiconductor device fabrication method according to the embodiment;

FIG. 6A and FIG. 6B provide process cross-sectional views of the semiconductor device further illustrating the semiconductor device fabrication method according to the embodiment;

FIG. 7A and FIG. 7B provide process cross-sectional views of the semiconductor device, further illustrating the semiconductor device fabrication method according to the embodiment;

FIG. 8A and FIG. 8B provides process cross-sectional views of the semiconductor device, further illustrating the semiconductor device fabrication method according to the embodiment;

FIG. 9A and FIG. 9B provide process cross-sectional views of the semiconductor device, further illustrating the semiconductor device fabrication method according to the embodiment;

DESCRIPTION OF EMBODIMENTS

Figure 11A:
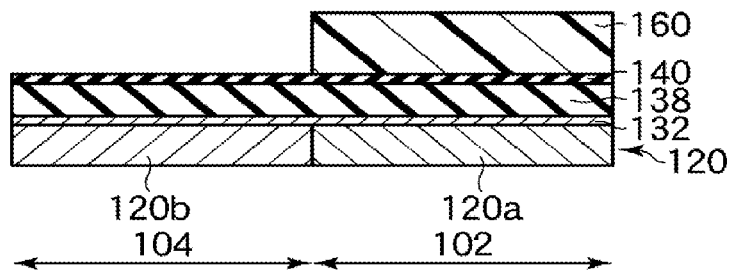
FIG. 11A-11E provide process cross-sectional views illustrating formation of a contact hole to a gate conductor of a CMOS circuit.
Figure 11B:
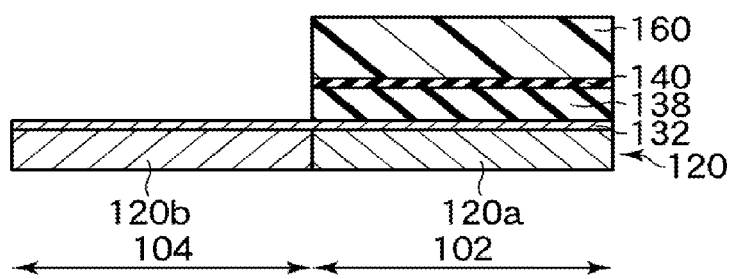
Figure 11C:
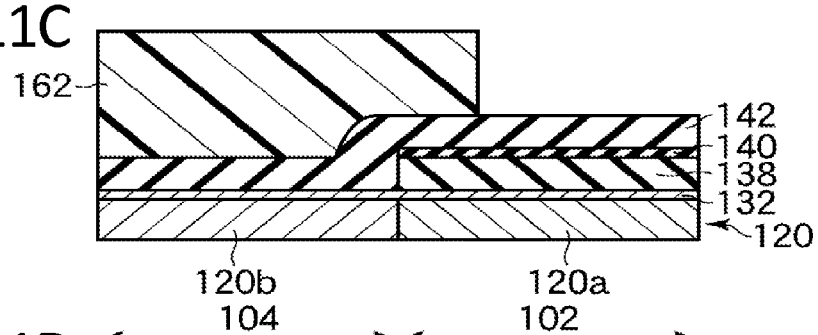
Figure 11D:
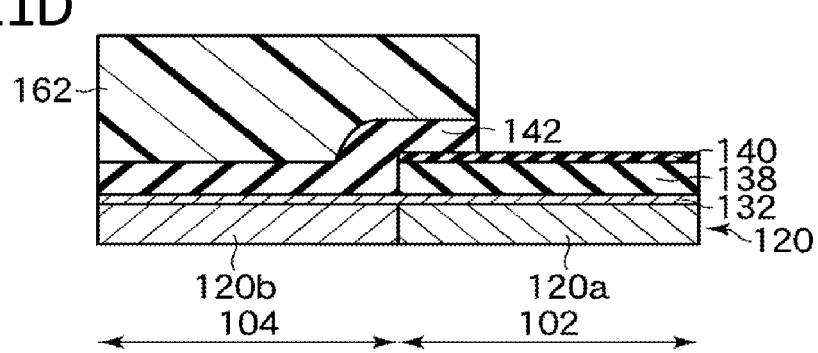
Figure 11E:
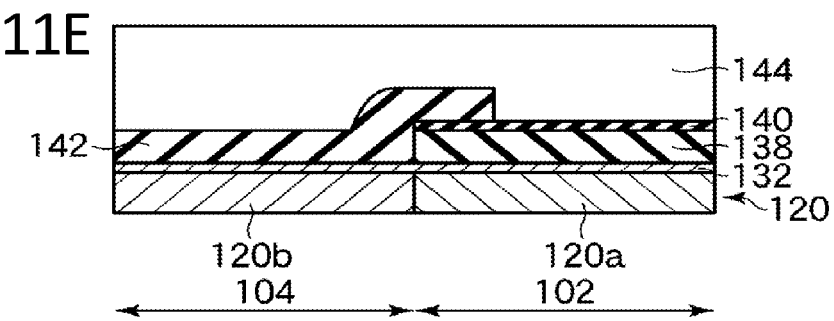
Figure 12:
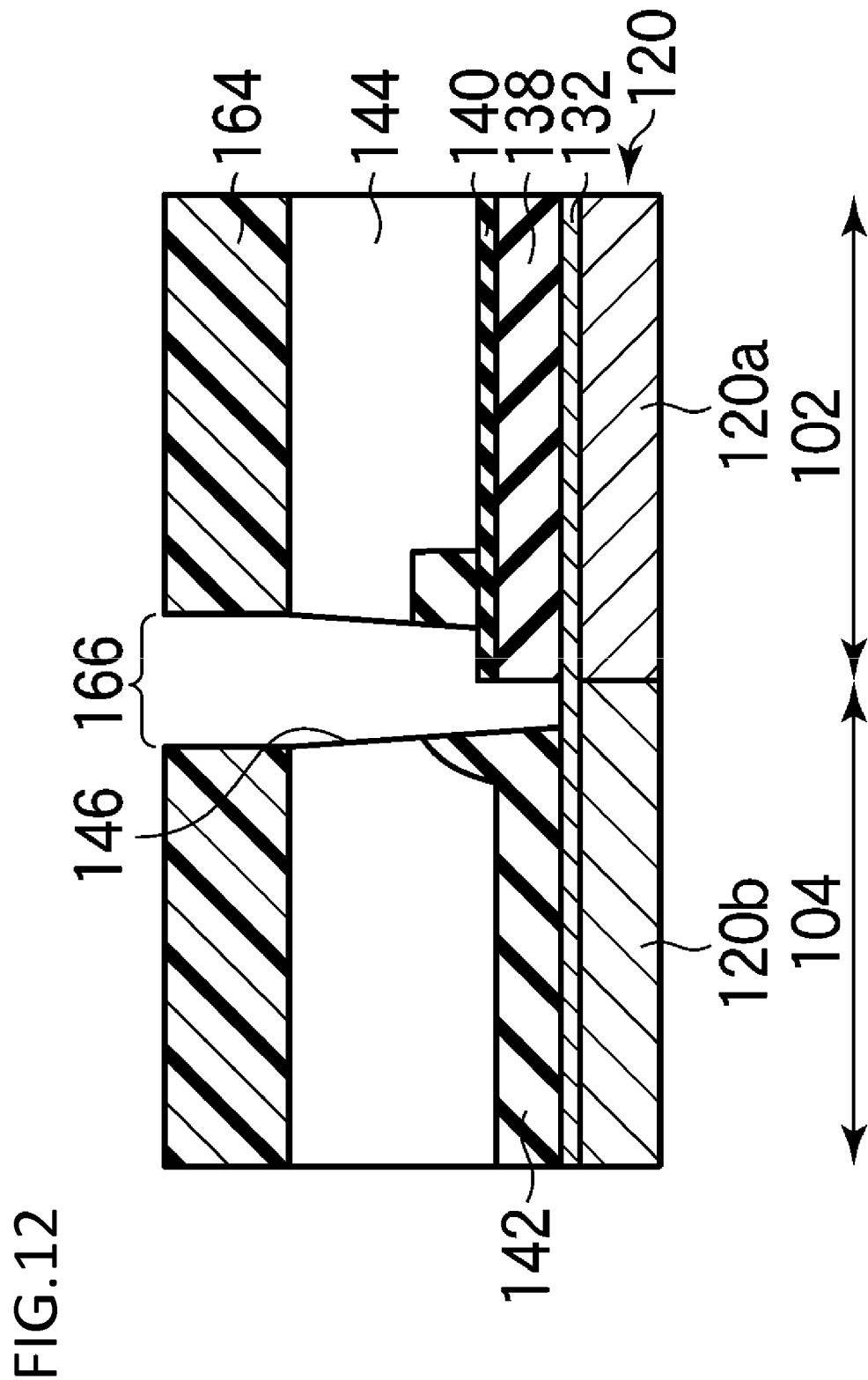
FIG. 12 is cross-sectional views further illustrating the formation of the contact hole to the gate conductor of a CMOS circuit.

FIGS. 11 and 12 are process cross-sectional views illustrating formation of a contact hole to a gate conductor of a CMOS circuit. The part below the gate conductor 120 is omitted from FIGS. 11 and 12.

In a PMOS transistor formation region 102 and an NMOS transistor formation region 104, a gate conductor 120 including the gate electrode 120a of a PMOS transistor and the gate electrode 120b of a NMOS transistor, respectively, is formed (see FIG. 11A). A silicide layer 132 is formed on the gate conductor 120. A compressive stress film 138 is formed over the semiconductor substrate (not shown) on which the PMOS and NMOS transistors have been formed. An etch stopper film 140 is formed on the compressive stress film 138. On the etch stopper film 140, a photoresist film 160 is formed that covers the PMOS transistor formation region 102 and exposes the NMOS transistor formation region 104.

Then, the photoresist film 160 is used as a mask to etch the etch stopper film 140 and the compressive stress film 138 as depicted in FIG. 11B.

A tensile stress film 142 is formed on the entire surface as depicted in FIG. 11C.

A photoresist film 162 is formed on the tensile stress film 142 to cover the NMOS transistor formation region 104 and a portion of the PMOS transistor formation region 102 that is adjacent to the NMOS transistor formation region 104.

As depicted in FIG. 11D, the tensile stress film 142 is etched by using the photoresist film 162 as a mask and the etch stopper film 140 as an etch stopper. Since the photoresist film 162 has been formed to cover the portion of the PMOS transistor formation region 102 as well, the edge of the tensile stress film 142 on the PMOS transistor formation region 102 side is located on the etch stopper film 140. Since the etching of the tensile stress film 142 stops at the etch stopper film 140, the compressive stress film 138 and the silicide layer 132 in a region of the boundary between the PMOS transistor formation region 102 and the NMOS transistor formation region 104 are not etched.

An interlayer insulating film 144 is then formed on the entire surface as depicted in FIG. 11E.

Then a photoresist film 164, in which an opening 166 is formed, is formed as depicted in FIG. 12.

Then, the photoresist film 164 is used as a mask to etch the interlayer insulating film 144 and the tensile stress film 142 to form a contact hole 146 down to the gate conductor 120.

When the contact hole 146 down to the gate conductor 120 is formed in this way, a portion of the etch stopper film 140 covers a portion of the area where the contact hole 146 is to be formed and obstructs the etching of the portion. Consequently, the cross-sectional area of the contact hole 146 become smaller at the bottom or an opening failure at the bottom may result, as depicted in FIG. 12.

Embodiment

A semiconductor device and a method for fabricating the semiconductor device according to one embodiment will be described with reference to FIGS. 1 through 10.

(Semiconductor Device)

Figure 1:
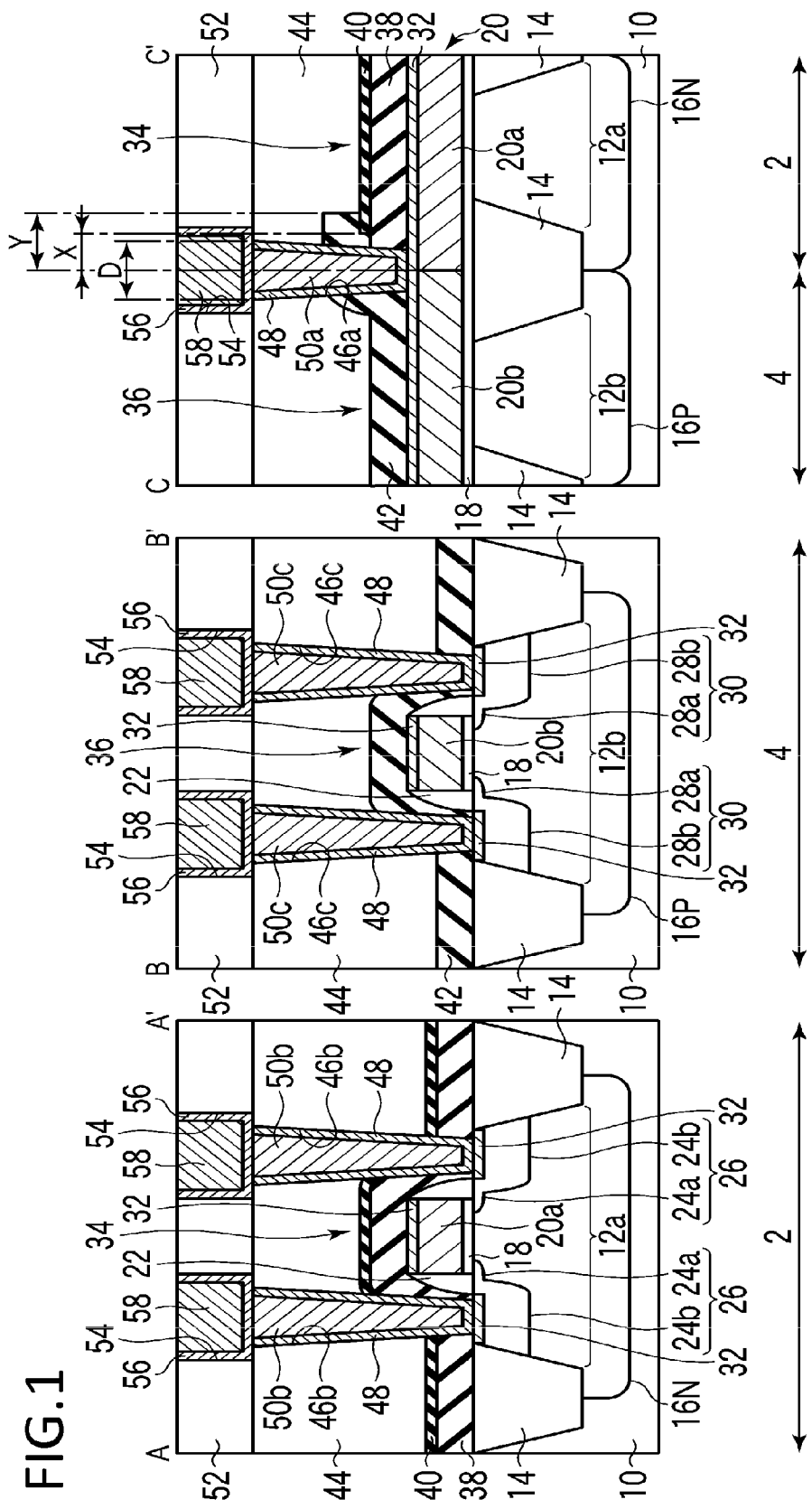
FIG. 1 depicts cross-sectional views of a semiconductor device according to an embodiment.

The semiconductor device according to the present embodiment will be described first with reference to FIGS. 1 and 2. FIG. 1 depicts cross-sectional views of the semiconductor device according to the present embodiment. FIG. 2 is a plan view of the semiconductor device according to the present embodiment. The left part of FIG. 1 depicts a cross section of a PMOS transistor formation region (first transistor formation region) 2 taken along line A-A' in FIG. 2. The middle part of FIG. 1 depicts a cross section of an NMOS transistor formation region (second transistor formation region) 4 taken along line B-B' in FIG. 2. The right part of FIG. 1 depicts a cross section along a gate conductor, which corresponds to line C-C' in FIG. 2.

As depicted in FIG. 1, an element isolating region 14 that separates element regions 12a and 12b is formed on a semiconductor substrate 10. The semiconductor substrate 10 is a P-type silicon substrate, for example. The element regions 12a and 12b separated by the element isolating region 14 are formed in the PMOS transistor formation region 2 and the NMOS transistor formation region 4, respectively.

An N-well 16N is formed in the semiconductor substrate 10 in the PMOS transistor formation region 2. A P-well 16P is formed in the semiconductor substrate 10 in the NMOS transistor formation region 4.

A gate electrode 20a is formed on the PMOS transistor formation region 2 with a gate insulating film 18 provided in between. A gate electrode 20b is formed on the NMOS transistor formation region 4 with a gate insulating film 18 provided in between.

The gate electrodes 20a and 20b are parts of a gate conductor 20 formed continuously in the PMOS transistor formation region 2 and the NMOS transistor formation region 4. The gate conductor 20 may be a polysilicon film, for example. The gate conductor 20 may include a silicide layer 32 formed on the polysilicon film.

A line width of the gate conductor 20 in the vicinity of the boundary between the PMOS transistor formation region 2 and the NMOS transistor formation region 4, namely the boundary region, is formed wider (see FIG. 2). Specifically, the wide section (connection section) 21 is formed in the gate conductor 20 in the region of the boundary between the PMOS transistor formation region 2 and the NMOS transistor formation region 4. Accordingly, the line width of the gate conductor 20 in the vicinity of the boundary between the PMOS transistor formation region 2 and the NMOS transistor formation region 4 is wider than the line width of the gate conductor 20 in the element regions 12a and 12b. The reason why the wide section 21 of the gate conductor 20 is provided is that a contact hole 46a in which a conductor plug 50a is to be embedded is formed down to the vicinity of the boundary between the PMOS transistor formation region 2 and the NMOS transistor formation region 4.

A P-type dopant is introduced into the portion of the gate conductor 20 that is located in the PMOS transistor formation region 2 to form the gate electrode 20a of a PMOS transistor 34. An N-type dopant is introduced into the portion of the gate conductor 20 that is located in the NMOS transistor formation region 4 to form the gate electrode 20b of an NMOS transistor 36. Thus, the portion of the gate conductor 20 in the PMOS transistor formation region 2 acts as the gate electrode 20a of the PMOS transistor 34 and the portion of the gate conductor 20 in the NMOS transistor formation region 4 acts as the gate electrode 20b of the NMOS transistor 36.

The boundary between the gate electrode 20a of the PMOS transistor 34 and the gate electrode 20b of the NMOS transistor 36 coincides with the boundary between the PMOS transistor formation region 2 and the NMOS transistor formation region 4.

A sidewall insulating film 22 is formed on sidewalls of the gate conductor 20, in particular, on the sidewalls of the gate electrode 20a of the PMOS transistor 34 and on the sidewalls of the gate electrode 20b of the NMOS transistor 36.

A source/drain diffusion layer 26 including a lightly-doped impurity diffusion layer (extension region) 24a and a heavily-doped impurity diffusion region 24b is formed in the semiconductor substrate 10 on both sides of the gate electrode 20a on which sidewall insulating film 22 has been formed.

A source/drain diffusion layer 30 including a lightly-doped impurity diffusion layer (extension region) 28a and a heavily-doped impurity diffusion region 28b is formed in the semiconductor substrate 10 on both sides of the gate electrode 20b on which sidewall insulating film 22 has been formed.

A silicide layer 32 is formed on the gate conductor 20 and the source/drain diffusion layers 26 and 30. The silicide layer 32 may be a nickel silicide or cobalt silicide layer, for example. The silicide layer 32 on the source/drain diffusion layers 26 and 30 functions as source/drain electrodes. The silicide layer 32 on the gate conductor 20 is provided in order to reduce the contact resistance between the gate conductor 20 and a barrier metal film 48 and resistance of the gate conductor 20.

Thus, the PMOS transistor 34 including the gate electrode 20a and the source/drain diffusion layer 26 has been formed in the PMOS transistor formation region 2. Likewise, the NMOS transistor 36 including the gate electrode 20b and the source/drain diffusion layer 30 has been formed in the NMOS transistor formation region 4.

A stress film (first stress film) 38 is formed over the semiconductor substrate 10 in the PMOS transistor formation region 2 to cover the PMOS transistor 34. The stress film 38 is provided in order to apply a compressive stress to the channel region of the PMOS transistor 34, thereby improving the carrier mobility. The stress film 38 may be a silicon nitride film, for example. The thickness of the stress film 38 is preferably chosen to be in the range of 30 to 100 nm. Here, the stress film 38 is approximately 80 nm thick, for example. The edge of the stress film 38 on the NMOS transistor formation region 4 side coincides with the boundary between the PMOS transistor formation region 2 and the NMOS transistor formation region 4.

An etch stopper film (insulating film) 40 having etch characteristics different from those of the stress film 38 is formed on the stress film 38. The etch stopper film 40 functions as an etch stopper when another stress film (second stress film) 42, which will be described later, is etched. The etch stopper film 40 may be a silicon oxide film, for example. The thickness of the etch stopper film 40 is preferably chosen to be in the range of 10 to 50 nm, for example. Here, the etch stopper film 40 is approximately 30 nm thick, for example. The etch stopper film 40 is formed in the PMOS transistor formation region 2 except a portion adjacent to the NMOS transistor formation region 4. That is, the edge of the etch stopper film 40 on the NMOS transistor formation region 4 side is at a distance from the boundary between the PMOS transistor formation region 2 and the NMOS transistor formation region 4. The distance X between the edge of the etch stopper film 40 on the NMOS transistor formation region 4 side and the boundary between the PMOS transistor formation region 2 and the NMOS transistor formation region 4 is approximately 60 nm, for example.

A stress film (second stress film) 42 is formed over the semiconductor substrate 10 in the NMOS transistor formation region 4 to cover the NMOS transistor 36. The stress film 42 is provided in order to apply a tensile stress to the channel region of the NMOS transistor 36, thereby improving the carrier mobility. The stress film 42 has etch characteristics different from those of the etch stopper film 40. The stress film 42 may be silicon nitride film, for example. The thickness of the stress film 42 is preferably chosen to be in the range of 30 to 100 nm, for example. Here, the stress film 42 is approximately 80 nm thick, for example. An end portion of the stress film 42 on the PMOS transistor formation region 2 side overlaps a portion of the stress film 38 and a portion of the etch stopper film 40. The distance Y between the edge of the stress film 42 on the PMOS transistor formation region 2 side and the boundary between the PMOS transistor formation region 2 and the NMOS transistor formation region 4 is approximately 80 nm, for example.

An interlayer insulating film 44 is formed over the semiconductor substrate 10 on which the stress film 38, the etch stopper film 40 and the stress film 42 have been formed. The top surface of the interlayer insulating film 44 is planarized. The thickness of the interlayer insulating film 44 is preferably chosen to be in the range of 200 to 500 nm, for example. Here, the interlayer insulating film 44 is approximately 400 nm thick, for example. The interlayer insulating film 44 may be silicon oxide or PSG (Phospho Silicate Glass) film, for example.

A contact hole 46a is formed that passes through the interlayer insulating film 44 and the stress films 42 and 38 down to the gate conductor 20 in the region of the boundary between the PMOS transistor formation region 2 and the NMOS transistor formation region 4. The contact hole 46a is located above the element isolating region 14 between the element regions 12a and 12b. The edge of the etch stopper film 40 on the NMOS transistor formation region 4 side is at a distance from the contact hole 46a.

The reason why the contact hole 46a in the present embodiment is formed in such a manner that the contact hole 46a reaches the gate conductor 20 in the region of the boundary between the PMOS transistor formation region 2 and the NMOS transistor formation region 4 is as follows. If the contact hole 46a were formed in a location apart from the boundary between the PMOS transistor formation region 2 and the NMOS transistor formation region 4, one of the PMOS transistor formation region 2 and the NMOS transistor formation region 4 would be larger in size than the other. In order to minimize the size of the PMOS transistor formation region 2 and the NMOS transistor formation region 4, the contact hole 46a that reaches the gate conductor 20 is preferably disposed in the region of the boundary between the PMOS transistor formation region 2 and the NMOS transistor formation region 4. Therefore, in the present embodiment, the contact hole 46a is formed that reaches the gate conductor 20 at the boundary between the PMOS transistor formation region 2 and the NMOS transistor formation region 4.

In the PMOS transistor formation region 2, a contact hole 46b is formed that passes through the interlayer insulating film 44, the etch stopper film 40 and the stress film 38 down to the source/drain electrode 32 of the PMOS transistor 34.

In the NMOS transistor formation region 4, a contact hole 46c is formed that passes through the interlayer insulating film 44 and the stress film 42 down to the source/drain electrode 32 of the NMOS transistor 36.

The diameter D of the contact holes 46a to 46c at the top is approximately 80 nm, for example.

A barrier metal film 48 is formed on the bottom and side of the contact holes 46a to 46c. The barrier metal film 48 is formed by depositing a Ti film (not shown) and a TiN film (not shown) in sequence.

Conductor plugs 50a to 50c are embedded in the contact holes 46a to 46c, respectively, in which barrier metal film 48 has been formed. The conductor plugs 50a to 50c are made of tungsten (W), for example. The conductor plug 50a is connected to the gate conductor 20 at the boundary between the PMOS transistor formation region 2 and the NMOS transistor formation region 4. The conductor plug 50b is connected to the source/drain electrode 32 of the PMOS transistor 34. The conductor plug 50c is connected to the source/drain electrode 32 of the NMOS transistor 36.

An interlayer insulating film 52 is formed on the interlayer insulating film 44 in which the conductor plugs 50a to 50c are embedded. The interlayer insulating film 52 may be a silicon oxide film, for example.

Trenches 54 for embedding interconnects 58 are formed in the interlayer insulating film 52. The top surface of the conductor plugs 50a to 50c is exposed at the bottom of each trench 54.

A barrier metal film 56 is formed in the trench 54. The barrier metal film 56 may be a tantalum (Ta) film, for example.

In the trench 54 in which the barrier metal film 56 has been formed, an interconnect 58 is embedded. The interconnect 58 is made of copper (Cu), for example.

In this way, a semiconductor device including the CMOS circuit having the PMOS transistor 34 and the NMOS transistor 36 is formed.

According to the present embodiment, the edge of the etch stopper film 40 on the NMOS transistor formation region 4 side is at a distance from the contact hole 46a as described above. Accordingly, etching of the contact hole 46a is not obstructed by the etch stopper film 40 and therefore the contact hole 46a is formed down to the gate conductor 20 in the region of the boundary between the PMOS transistor formation region 2 and the NMOS transistor formation region 4. According to the present embodiment, a good contact hole 46 may be formed that passes through the interlayer insulating film 44 and the stress films 42 and 38. Since the conductor plug 50a is embedded in such contact hole 46a, the conductor plug 50a may be reliably connected to the gate conductor 20. Consequently, a reliable semiconductor device may be provided with a high manufacturing yield.

(Semiconductor Device Fabrication Method)

A method for fabricating a semiconductor device according to the present embodiment will be described with reference to FIGS. 3 to 10. FIGS. 3 to 10 are process cross-sectional views illustrating a semiconductor device fabrication method according to the present embodiment.

Figure 3A:
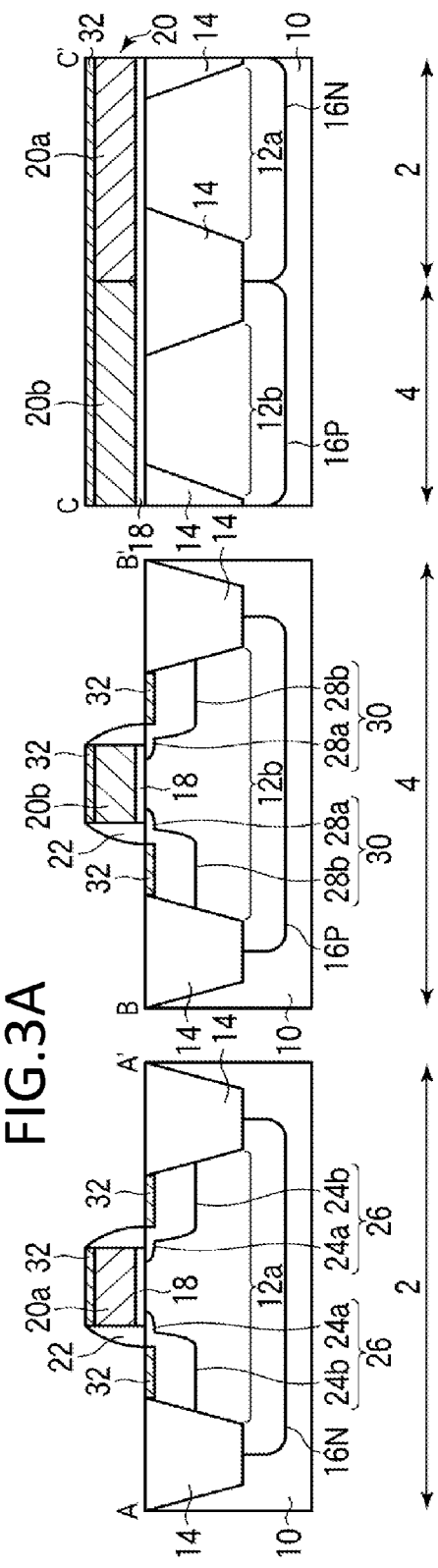
FIG. 3A and FIG. 3B provide process cross-sectional views of a semiconductor device, illustrating a semiconductor device fabrication method according to the embodiment.

First, an element isolating region 14 that separates element regions 12a, 12b is formed on a semiconductor substrate 10 by STI (Shallow Trench Isolation) (see FIG. 3A). The semiconductor substrate 10 may be a P-type silicon semiconductor substrate, for example. Thus, the element region 12a separated by the element isolating region 14 is formed in a PMOS transistor formation region 2. Likewise, the element region 12b separated by the element isolating region 14 is formed in the NMOS transistor formation region 4.

Then, a photoresist film (not shown) is formed on the entire surface with spin coating, for example.

Photolithography is used to form opening (not shown) that exposes the PMOS transistor formation region 2 in the photoresist film.

The photoresist film is used as a mask to introduce an N-type dopant into the semiconductor substrate 10 by ion implantation, for example. As a result, an N-well 16N is formed in the semiconductor substrate 10 in the PMOS transistor formation region 2.

Then, a photoresist film (not shown) is formed on the entire surface with spin coating, for example.

Photolithography is used to form an opening (not shown) that exposes the NMOS transistor formation region 4 in the photoresist film.

The photoresist film is used as a mask to introduce a P-type dopant into the semiconductor substrate 10 by ion implantation, for example. As a result, a P-well 16P is formed in the semiconductor substrate 10 in the NMOS transistor formation region 4.

Then, a gate insulating film 18 is formed on the surface of the semiconductor substrate 10 by thermal oxidization, for example, to a thickness of 1.5 nm, for example. The gate insulating film 18 may be a silicon oxide film, for example.

Then, a polysilicon film is formed on the entire surface by CVD (Chemical Vapor Deposition), for example, to a thickness of 100 nm, for example. The polysilicon film will be formed into a gate conductor 20 later.

A photoresist film (not shown) is formed on the entire surface with spin coating, for example.

Photolithography is used to pattern the photoresist film into the geometry of the gate conductor 20.

The photoresist film is used as a mask to etch the polysilicon film. As a result, the gate conductor 20 of the polysilicon film is formed continuously in the PMOS transistor formation region 2 and the NMOS transistor formation region 4.

The line width of the gate conductor 20 at the boundary between the PMOS transistor formation region 2 and the NMOS transistor formation region 4, namely in the boundary region, is formed wider (see FIG. 2). Specifically, the line width of the gate conductor 20 at the boundary between the PMOS transistor formation region 2 and the NMOS transistor formation region 4 is formed wider than the line width of the gate conductor 20 in the element regions 12a, 12b. The reason why the line width of the gate conductor 20 is made wider in the vicinity of the boundary between the PMOS transistor formation region 2 and the NMOS transistor formation region 4 is that a contact hole 46a will be formed later down to the wider line. Then, the photoresist film is removed by ashing.

Then, a photoresist film (not shown) is formed on the entire surface with spin coating, for example.

Photolithography is used to form an opening (not shown) that exposes the PMOS transistor formation region 2 in the photoresist film.

The photoresist film and the gate conductor 20 are used as a mask to introduce a P-type dopant into the semiconductor substrate 10 with ion implantation, for example. As a result, a lightly-doped P-type impurity region (extension region) 24a is formed in the semiconductor substrate 10 on both sides of the gate conductor 20 in the PMOS transistor formation region 2. Then, the photoresist film is removed by ashing, for example.

Then, a photoresist film (not shown) is formed on the entire surface with spin coating, for example.

Photolithography is used to form an opening (not shown) that exposes the NMOS transistor formation region 4 in the photoresist film.

Then, the photoresist film and the gate conductor 20 are used as a mask to introduce an N-type dopant into the semiconductor substrate 10 by ion implantation, for example. As a result, a lightly-doped N-type impurity region (extension region) 28a is formed in the semiconductor substrate 10 on both sides of the gate conductor 20 in the NMOS transistor formation region 4. Then, the photoresist film is removed by ashing, for example.

Then, an insulating film is formed on the entire surface by CVD, for example. The insulating film will be formed into a sidewall insulating film. The insulating film may be a silicon oxide film, for example, formed to a thickness of 30 nm, for example.

Then, the insulating film is etched by anisotropic etching. As a result, a sidewall insulating film 22 is formed on the sidewalls of the gate conductor 20.

Then, a photoresist film (not shown) is formed on the entire surface with spin coating, for example.

Photolithography is used to form an opening (not shown) that exposes the PMOS transistor formation region 2 in the photoresist film.

Then, the photoresist film, the gate conductor 20 and the sidewall insulating film 22 are used as a mask to introduce a P-type dopant into the semiconductor substrate 10 with ion implantation, for example. As a result, a heavily-doped P-type impurity region 24b is formed in the semiconductor substrate 10 on both sides of the gate conductor 20 in the PMOS transistor formation region 2. Thus, a source/drain diffusion layer 26 having an extension source/drain structure is formed at the lightly-doped impurity region (extension region) 24a and the heavily-doped impurity region 24b.

During the implantation of the P-type dopant for forming the source/drain diffusion layer 26, the P-type dopant is also introduced into the gate conductor 20 in the PMOS transistor formation region 2. As a result, the portion of the gate conductor 20 in the PMOS transistor formation region 2 becomes a gate electrode 20e doped with the P-type dopant. Then the photoresist film is removed by ashing, for example.

Then a photoresist film (not shown) is formed on the entire surface with spin coating, for example.

Photolithography is used to form an opening (not shown) that exposes the NMOS transistor formation region 4 in the photoresist film.

The photoresist film, the gate conductor 20 and the sidewall insulating film 22 are used as a mask to introduce an N-type dopant into the semiconductor substrate 10 with ion implantation, for example. As a result a heavily-doped N-type impurity region 28b is formed in the semiconductor substrate 10 on both sides of the gate conductor 20 in the NMOS transistor formation region 4. Thus, a source/drain diffusion layer 30 having an extension source/drain structure is formed at the lightly-doped impurity region (extension region) 28a and the heavily-doped impurity region 28b.

During the introduction of the N-type dopant for forming the source/drain diffusion layer 30, the N-type dopant is also introduced into the gate conductor 20 in the NMOS transistor formation region 4. Thus, the portion of the gate conductor 20 in the NMOS transistor formation region 4 becomes a gate electrode 20b doped with the N-type dopant. The boundary between the gate electrode 20a of the PMOS transistor 34 and the gate electrode 20b of the NMOS transistor 36 coincides with the boundary between the PMOS transistor formation region 2 and the NMOS transistor formation region 4. Then, the photoresist film is removed by ashing, for example.

Then, a high-melting-point metal film is formed on the entire surface. The high-melting-point metal film may be a nickel or cobalt film, for example. The thickness of the high-melting-point metal film is approximately 10 nm, for example.

Then, heat treatment is applied to cause silicon atoms in the semiconductor substrate 10 to react with metal atoms in the high-melting-point metal film and to cause silicon atoms in the gate conductor 20 to react with metal atoms in the high-melting-point metal film. The heat treatment is performed at a temperature in the range of approximately 200 to 300° C., for example.

Then, the unreacted portions of the high-melting-point metal film are etched away.

As a result, a silicide layer 32 is formed on each of the source/drain diffusion layers 26 and 30. The silicide layer 32 formed on each of the source/drain diffusion layers 26 and 30 functions as source/drain electrode. The silicide layer 32 is formed on top of the gate conductor 20 as well.

Thus, a PMOS transistor 34 including the gate electrode 20a and the source/drain diffusion layer 26 is formed in the PMOS transistor formation region 2. An NMOS transistor 36 including the gate electrode 20b and the source/drain diffusion layer 30 is formed in the NMOS transistor formation region 4.

Figure 3B:
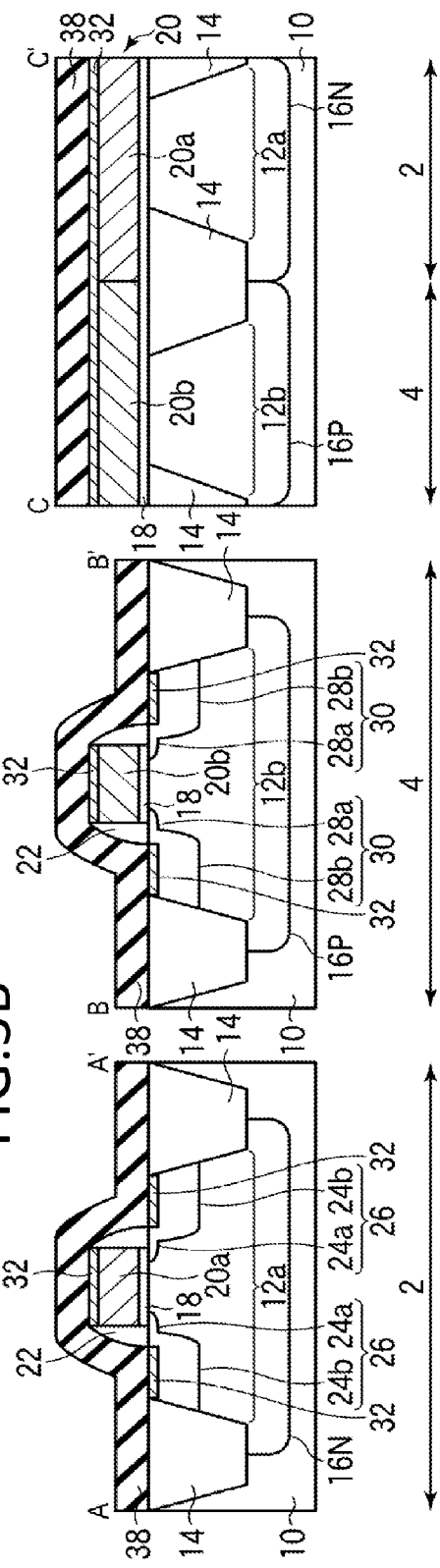

Then, a stress film (first stress film) 38 is formed on the entire surface by plasma-enhanced CVD, for example (see FIG. 3B). The stress film 38 is intended to apply a compressive stress to the channel region of the PMOS transistor 34 to improve the carrier mobility in the channel region.

The stress film (compressive stress film 38) may be formed as follows, for example. The stress film 38 is formed in a vacuum chamber using a parallel-plate plasma-enhanced CVD system, for example. The temperature of the substrate during formation of the stress film 38 is maintained at approximately 400° C., for example. The vacuum chamber is supplied with $N_2$ gas, $H_2$ gas, $NH_3$ gas, $SiH_4$ gas and $(CH_3)_3SiH$ (trimethylsilane) gas, for example, at the same time. The flow rate of the $N_2$ gas is set at a value in the range of 500 to 3000 sccm, for example. The flow rate of the $H_2$ gas is set at a value in the range of 500 to 3000 sccm, for example. The flow rate of the $NH_3$ gas is set at a value in the range of 100 to 1000 sccm, for example. The flow rate of the $SiH_4$ gas is set at a value in the range of 200 to 500 sccm, for example. The flow rate of the $(CH_3)_3SiH$ gas is set at a value in the range of 50 to 150 sccm, for example. The pressure in the chamber is set at a value in the range of 1 to 10 Torr, for example. The frequency of high-frequency power applied is set at 13.56 MHz. The magnitude of the high-frequency power applied is set at a value in the range of approximately 100 to 500 W, for example. The deposition time for the stress film 38, that is, the plasma excitation time is set at a value in the range of approximately 10 to 100 seconds. The compressive stress film 38 is formed preferably to a thickness in the range of 30 to 100 nm, for example. Here, the compressive stress film 38 is formed to approximately 80 nm, for example.

Figure 4A:
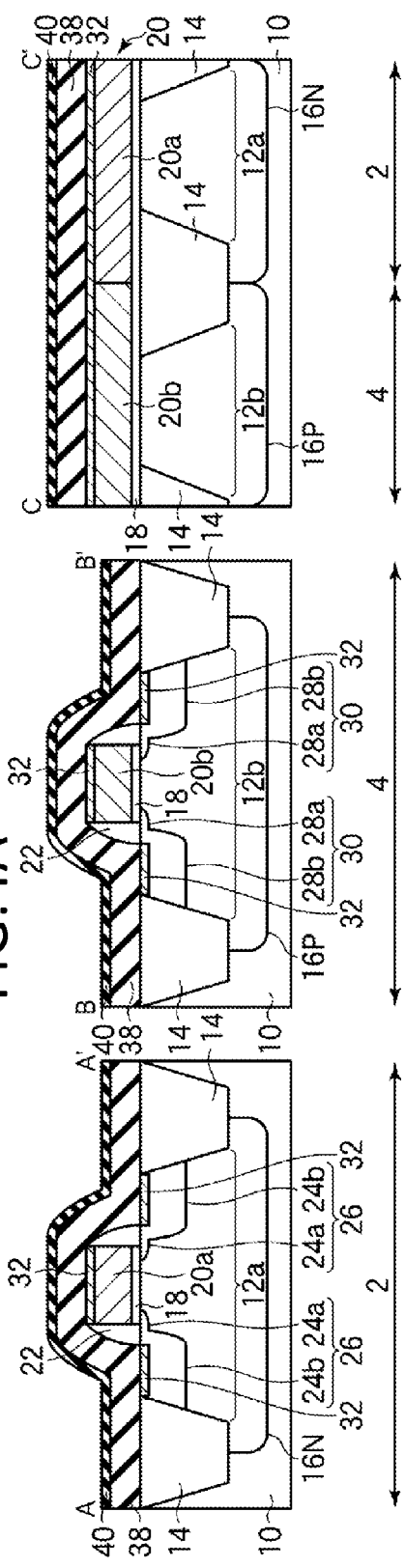
FIG. 4A and FIG. 4B provide process cross-sectional views of the semiconductor device, further illustrating the semiconductor device fabrication method according to the embodiment.

Then, an etch stopper film (insulating film) 40 is formed on the entire surface by plasma-enhanced CVD, for example (see FIG. 4A). The etch stopper film 40 will function as the etch stopper during etching of another stress film (second stress film) 42 which will be formed in a subsequent stage. Therefore, the etch stopper film 40 is made of a material having etch characteristics different from those of the material of the stress film 42 formed in the subsequent stage. The etch characteristics of the etch stopper film 40 also differ from those of the stress film 38 under the etch stopper film 40. The etch stopper film 40 may be a silicon oxide film deposited from a material such as TEOS (Tetraethoxysilane), for example, preferably to a thickness in the range of 10 to 50 nm, for example. Here, the etch stopper film 40 is formed to a thickness of approximately 30 nm, for example.

Then, a photoresist film 60 is formed on the entire surface with spin coating, for example.

Figure 4B:
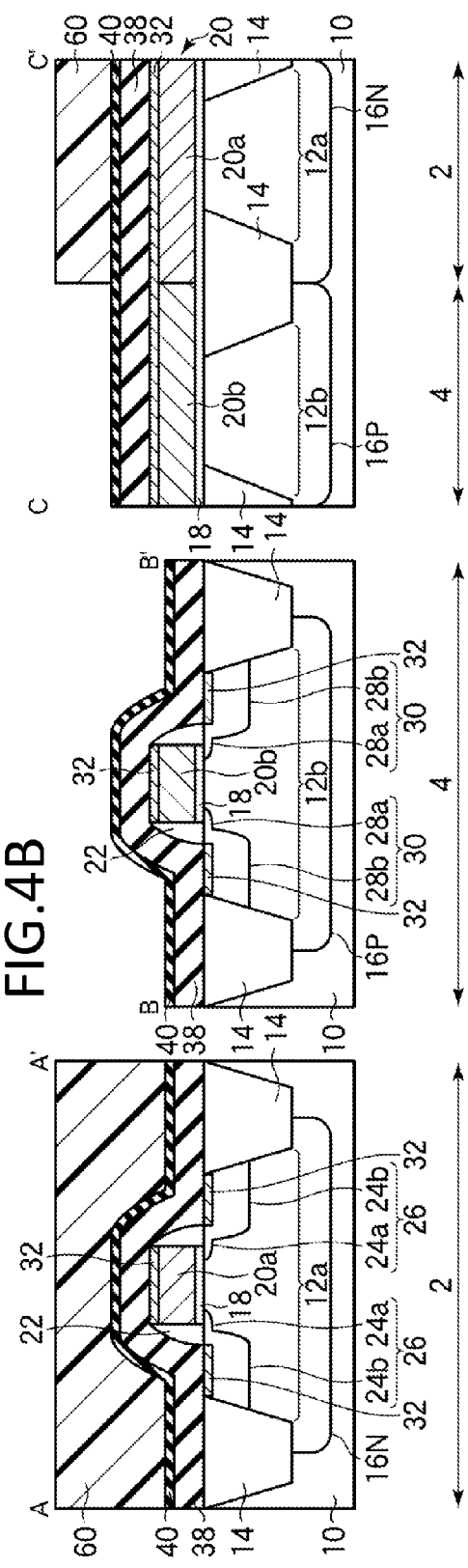

Photolithography is used to pattern the photoresist film 60 (see FIG. 4B). As a result, the photoresist film 60 is formed that covers the PMOS transistor formation region 2 and exposes the NMOS transistor formation region 4. The edge of the photoresist film 60 on the NMOS transistor formation region 4 side coincides with the boundary between the PMOS transistor formation region 2 and the NMOS transistor formation region 4.

Then, the photoresist film 60 is used as a mask to isotropically etch the etch stopper film 40 (see FIG. 5A). The isotropic etching etches a portion of the region of the etch stopper film 40 that is covered with the photoresist film 60 as well as the portion of the etch stopper film 40 that is exposed in the photoresist film 60. That is, a portion of the etch stopper film 40 in the PMOS transistor formation region 2 that is adjacent to the NMOS transistor formation region 4 is etched in the direction parallel to the surface of the semiconductor substrate 10 (side etching). In other words, the etch stopper film 40 under the photoresist film 60 is etched by a predetermined width X from the edge of the photoresist film 60 in the direction parallel to the surface of the semiconductor substrate 10.

Wet etching, for example, may be used as the isotropic etching of the etch stopper film 40. An etchant containing hydrofluoric acid and ammonium fluoride, for example, is used. The concentration of the hydrofluoric acid in the etchant is approximately 0.5% by weight, for example. The concentration of the ammonium fluoride is approximately 30% by weight, for example.

The etchant is not limited to one containing hydrofluoric acid and ammonium fluoride. Preferably, an etchant that etches the etch stopper film 40 at a higher etch rate than the stress film 38 is used. This is because if the stress film 38 is excessively etched to an excessive thinness during etching of the etch stopper film 40, the stress film 38 will not be able to apply a sufficient stress to the channel region of the PMOS transistor 34.

The etch stopper film 40 may be isotropically etched by chemical dry etching, for example. Specifically, a remote plasma dry etching system may be used to excite an etch gas to generate radicals, which may then be applied to the semiconductor substrate to isotropically etch the etch stopper film 40. In this case, an etch gas and other parameters are preferably chosen so that the etch stopper film 40 is etched at a sufficiently higher etch rate than the stress film 38.

The side etching amount X, that is, the distance X between the edge of the etch stopper film 40 on the PMOS transistor formation region 2 side and the boundary between the PMOS transistor formation region 2 and the NMOS transistor formation region 4 is determined by considering the following factors.

If the distance X is too small, the etch stopper film 40 will obstruct etching for forming a contact hole 46 in a subsequent stage. In order to prevent the etch stopper film 40 from obstructing the etching of the contact hole 46a, the edge of the etch stopper film 40 on the PMOS transistor formation region 2 side is preferably located at a distance from the contact hole 46a. Specifically, the distance X is preferably greater than the radius (D/2) of the contact hole 46a.

During patterning of the photoresist film 60 and during patterning of a photoresist film 64 for forming a contact hole 46a in a subsequent stage, an alignment error may occur in the photolithography. In order to reliably prevent the etch stopper film 40 from obstructing etching for formation of the contact hole 46a, preferably an alignment error in the photolithography is taken into account. Therefore, preferably a side etching amount X that satisfies the following expression (1) is chosen.

$$(D/2)+P<X \tag{1}$$

Here, P is the maximum alignment error in the photolithography and (D/2) is the radius of the contact hole 46a.

By setting the radius of the contact hole 46a and the side etching amount X that satisfy expression (1), obstruction by the etch stopper film 40 of etching of the contact hole 46a may be more reliably prevented.

Consequently, the etch stopper film 40 remains in a portion of the PMOS transistor formation region 2 except the portion adjacent to the NMOS transistor formation region 4. That is, the distance X between the edge of the etch stopper film 40 on the NMOS transistor formation region 4 side is at a distance from the boundary between the PMOS transistor formation region 2 and the NMOS transistor formation region 4. The distance X between the edge of the etch stopper film 40 on the NMOS transistor formation region 4 side and the boundary between the PMOS transistor formation regions 2 and the NMOS transistor formation region 4 is approximately 60 nm, for example.

Then, the photoresist film 60 is used as a mask to anisotropically etch the stress film 38 (see FIG. 5B). The anisotropic etching is performed in a vacuum chamber using a parallel-plate dry etching system, for example. The temperature of the substrate during the etching is maintained at approximately 25° C. The etch gas introduced into the vacuum chamber may be a mixed gas which may be any combination of $C_4F_8$, $C_4F_6$, $CF_4$, $CHF_3$, $CH_2F_2$, $CH_3F$, $O_2$, CO, and Ar gasses. For example, the etch gas may be a mixture of $C_4F_6$, $O_2$ and Ar gasses. In this case, the flow proportions of the gases are: $C_4F_6$ (1 to 20): $O_2$ (1 to 20):Ar (300 to 1000), for example. The total flow rate of the mixture of the $C_4F_6$, $O_2$ and Ar gasses is set at a value in the range of 300 to 1000 sccm, for example. The pressure in the chamber is maintained at a value in the range of 10 to 300 mTorr, for example. The frequency of the high-frequency power applied is set at 13.56 MHz, for example. The magnitude of the high-frequency power applied is set at a value in the range of approximately 100 to 1000 W, for example. The etch gas may be changed to another mixed gas of another combination during the etching. For example, the etch gas may be changed to a mixed gas of $CH_3F$, $O_2$ and Ar gasses. In that case, the flow proportions of the gasses are: $CH_3F$ (5 to 100): $O_2$ (1 to 300):Ar (0 to 1000), for example. The total flow rate of the mixed gas of $CH_3F$, $O_2$ and Ar gasses is in the range of 300 to 1000 sccm, for example.

Then, the photoresist film 60 is removed by ashing, for example (see FIG. 6A).

Then, a stress film (second stress film) 42 is formed by plasma-enhanced CVD (see FIG. 6B), for example. The stress film 42 is intended to apply a tensile stress to the channel region of the NMOS transistor 36 to improve the carrier mobility in the channel region.

The stress film (tensile stress film) 42 may be formed, for example, as follows. The stress film 42 is formed in a vacuum chamber using a parallel-plate plasma-enhanced CVD system, for example. The temperature of the substrate during formation of the stress film 42 is maintained at approximately 400° C., for example. The vacuum chamber is supplied with $N_2$, $NH_3$, and $SiH_4$ gasses, for example, at the same time. The flow rate of the $N_2$ gas is set at a value in the range of 500 to 3000 sccm, for example. The flow rate of the $NH_3$ gas is set at a value in the range of 100 to 1000 sccm, for example. The flow rate of the $SiH_4$ gas is set at a value in the range of 200 to 500 sccm, for example. The pressure in the chamber is maintained in the range of 1 to 10 Torr, for example. The frequency of the high-frequency power applied is set at 13.56 MHz, for example. The magnitude of the high-frequency power applied is set at a value in the range of approximately 100 to 500 W, for example. The deposition time for the stress film 42, that is, the plasma excitation time, is set at a value in the range of approximately 10 to 100 seconds. In this way, a silicon nitride film is formed on the entire surface. Then, an ultraviolet irradiation system is used to expose the silicon nitride film to ultraviolet light. The ultraviolet light source may be a broadband ultraviolet light source. The silicon nitride is exposed to the ultraviolet light in the atmosphere of helium (He), for example. The ultraviolet exposure time is in the range of approximately 180 to 600 seconds, for example.

In this way, the tensile stress film 42 of silicon nitride is formed. The stress film 42 is formed preferably to a thickness in the range of approximately 30 to 100 nm. Here, the thickness of the stress film 42 is approximately 80 nm, for example. The stress film 42 has etch characteristics different from those of the etch stopper film 40.

Then, a photoresist film 62 is formed on the entire surface with spin coating, for example.

Then, photolithography is used to pattern the photoresist film 62 (see FIG. 7A). The photoresist film 62 is formed to cover a portion of the PMOS transistor formation region 2 as well as the NMOS transistor formation region 4. Specifically, the photoresist film 62 is formed in such a manner that the photoresist film 62 covers the NMOS transistor formation region 4 and the edge of the photoresist film 62 on the PMOS transistor formation region 2 side is located over the etch stopper film 40.

The distance Y between the edge of the photoresist film 62 on the PMOS transistor formation region 2 side and the boundary between the PMOS transistor formation region 2 and the NMOS transistor formation region 4 is determined by considering the following factors.

If the distance Y is too small, portions of the stress film 38 and the silicide layer 32 in the region that are not covered by the etch stopper film 40 may be etched when the stress film 42 is etched by using the etch stopper film 40 as the etch stopper in a subsequent stage. To prevent the stress film 38 and the silicide layer 32 from being etched during etching of the stress film 42, the edge of the photoresist film 62 on the PMOS transistor formation region 2 is set on the etch stopper film 40. Specifically, the distance Y is preferably greater than the distance X.

An alignment error in photolithography may occur during patterning of the photoresist film 62. In order to reliably prevent the stress film 38 from being etched during etching of the stress film 42, more preferably an alignment error in the photolithography is taken into consideration. Therefore, preferably a distance Y that satisfies the following expression (2) is chosen.

$$Y-Q>X \quad (2)$$

Here, Q is the maximum alignment error in the photolithography.

Choosing distances X and Y that satisfy Expression (2) may more reliably prevent etching of the stress film 38 and the silicide layer 32 during etching of the stress film 42.

Then, the stress film 42 is anisotropically etched by using the photoresist film 62 as a mask and the etch stopper film 40 as the etch stopper (see FIG. 7B). The anisotropic etching is performed in a vacuum chamber using a parallel-plate dry etching system, for example. The temperature of the substrate during etching is maintained at approximately 25° C., for example. The etch gas introduced into the vacuum chamber may be a mixed gas which may be any combination of $C_4F_8$, $C_4F_6$, $CF_4$, $CHF_3$, $CH_2F_2$, $CH_3F$, $O_2$, CO, and Ar gasses. For example, the etch gas may be a mixture of $C_4F_8$, $O_2$ and Ar gasses. In this case, the flow proportions of the gasses are: $C_4F_8$ (1 to 20): $O_2$ (1 to 20):Ar (300 to 1000), for example.

The total flow rate of the mixture of the $C_4F_8$, $O_2$ and Ar gasses is set at a value in the range of 300 to 1000 sccm, for example. The pressure in the chamber is maintained at a value in the range of 10 to 300 mTorr, for example. The frequency of the high-frequency power applied is set at 13.56 MHz, for example. The magnitude of the high-frequency power applied is set at a value in the range of approximately 100 to 1000 W, for example. The etch gas may be changed to another mixed gas of another combination during the etching. For example, the etch gas may be changed to a mixed gas of $CH_3F$, $O_2$ and Ar gasses. In that case, the proportions of the gases are: $CH_3F$ (5 to 100): $O_2$ (1 to 300): Ar (0 to 1000), for example. The total flow rate of the mixed gas of $CH_3F$, $O_2$ and Ar gasses is in the range of 300 to 1000 sccm, for example.

Then, the photoresist film 62 is removed by ashing, for example (see FIG. 8A).

In this way, the stress film 42 is formed in such a manner that the end portion of the stress film 42 on the PMOS transistor formation region 2 side is on the etch stopper film 40. That is, the stress film 42 is formed in such a manner that a portion of the stress film 42 overlaps a portion of the stress film 38 and a portion of the etch stopper film 40. The distance Y between the edge of the stress film 42 on the PMOS transistor formation region 2 side and the boundary between the PMOS transistor formation region 2 and the NMOS transistor formation region 4 is chosen to be greater than the distance X. The distance Y between the edge of the stress film 42 on the PMOS transistor formation region 2 side and the boundary between the PMOS transistor formation region 2 and the NMOS transistor formation region 4 is chosen to be approximately 80 nm, for example.

Then, an interlayer insulating film 44 is formed on the entire surface by CVD, for example (see FIG. 8B). The interlayer insulating film 44 is preferably formed to a thickness in the range of 200 to 500 nm, for example. Here, the interlayer insulating film 44 is formed to a thickness of approximately 400 nm, for example. The interlayer insulating film 44 is a silicon oxide or PSG (Phospho Silicate Glass) film, for example.

Then, the surface of the interlayer insulating film 44 is planarized by CMP (Chemical Mechanical Polishing), for example.

A photoresist film 64 is then formed with spin coating, for example (see FIG. 9A).

Then, photolithography is used to form openings 66a to 66c in the photoresist film 64. The opening 66a is used for forming a contact hole 46a. The radius (D/2) of the opening 66 used for forming the contact hole 46a is chosen to be smaller than the distance X. More preferably, the radius (D/2) of the opening 66 used for forming a contact hole 46a satisfies the expression (1) given earlier. The opening 66a is formed in such a manner that the center of the opening 66a is located above the gate conductor 20 at the boundary between the PMOS transistor formation region 2 and the NMOS transistor formation region 4. The openings 66b and 66c are used to form contact holes 46b and 46c, respectively. The openings 66b and 66c are formed above the silicide layer 32. Here, the diameter D of the opening 66a is approximately 80 nm, for example.

Then, the photoresist film 64 is used as a mask to etch the interlayer insulating film 44 and the stress films 42 and 38. The etching is performed in a vacuum chamber using a parallel-plate dry etching system, for example. The temperature of the substrate during etching is maintained at approximately 25° C., for example. The etch gas introduced into the vacuum chamber may be a mixed gas which may be any combination of $C_4F_8$, $C_4F_6$, $CF_4$, $CHF_3$, $CH_2F_2$, $CH_3F$, $O_2$, CO and Ar gasses.

Specifically, the etch gas used for etching the interlayer insulating film 44 may be a mixed gas of $C_4F_6$, $O_2$ and Ar gases, for example. In this case, the proportions of the gasses are: $C_4F_6$ (1 to 50):$O_2$ (1 to 50):Ar (300 to 1000), for example. The total flow rate of the mixed gas of $C_4F_6$, $O_2$ and Ar gasses is in the range of 300 to 1000 sccm, for example. The pressure in the chamber is set at a value in the range of 10 to 300 mTorr. The frequency of high-frequency power applied is set at 13.56 MHz, for example. The magnitude of the high-frequency power applied is set at a value in the range of approximately 100 to 1000 W, for example.

The etch gas used for etching the stress films 42 and 38 may be a mixed gas of $CH_3F$, $O_2$ and Ar gases, for example. In this case, the proportions of the gasses are: $CH_3F$ (5 to 100): $O_2$ (1 to 30): Ar (0 to 1000), for example. The total flow rate of the mixed gas of $CH_3F$, $O_2$ and Ar gasses is set at a value in the range of 300 to 1000 sccm, for example. The pressure in the chamber is set at a value in the range of 10 to 300 mTorr, for example. The frequency of high-frequency power applied is set at 13.56 MHz, for example. The magnitude of the high-frequency power applied is set at a value in the range of approximately 100 to 1000 W, for example.

In this way, a contact hole 46a that passes through the interlayer insulating film 44 and the stress films 42 and 38 is formed down to the gate conductor 20 in the vicinity of boundary between the boundary between the PMOS transistor formation region 2 and the NMOS transistor formation region 4. The contact hole 46a has a diameter D at its top of approximately 80 nm, for example.

A contact hole 46b is formed that passes through the interlayer insulating film 44, the etch stopper film 40 and the stress film 38 in the PMOS transistor formation region 2 down to the source/drain electrode 32 of the PMOS transistor 34. A contact hole 46c that passes through the interlayer insulating film 44 and the stress film 42 is formed in the NMOS transistor formation region 4 down to the source/drain electrode 32 of the NMOS transistor 36.

Since the edge of the etch stopper film 40 on the NMOS transistor formation region 4 side is at a distance from the location where the contact hole 46a is to be formed, etching for forming the contact hole 46a is not obstructed by the etch stopper film 40. Accordingly, according to the present embodiment, the contact hole 46a that reaches the gate conductor 20 in the region of the boundary between the PMOS transistor formation region 2 and the NMOS transistor formation region 4 may be reliably formed.

The stress film 38 has etch characteristics slightly different from those of the stress film 42. However, the difference in etch rate between the stress films 38 and 42 is negligibly small compared with the difference in etch rate between the etch stopper film 40 and the stress film 42. The difference in etch rate between the stress films 38 and 42 is negligibly small compared with the difference in etch rate between the etch stopper film 40 and the stress film 38. The slight difference in etch rate between the stress films 38 and 42 does not obstruct formation of the contact hole 46a and does not pose any particular problem.

Then, the photoresist film 64 is removed by ashing, for example.

Then a barrier metal film 48 is formed on the entire surface by sputtering, for example. The barrier metal film 48 is formed by depositing a Ti film (not shown) and a TiN film (not shown) in sequence. The Ti film is deposited to a thickness in the range of approximately 3 to 10 nm, for example. The TiN film is deposited to a thickness in the range of approximately 3 to 10 nm, for example.

Then a conducting film is formed on the entire surface by CVD, for example. The conducting film will become conductor plugs 50a to 50c. The conducting film may be a tungsten film, for example, formed to thickness in the range of approximately 50 to 400 nm, for example.

Then, the conducting film and the barrier metal film 48 are polished to expose the surface of the interlayer insulating film 44 by CMP, for example. As a result, conductor plugs 50a to 50c are embedded in the contact holes 46a to 46c, respectively, in which the barrier metal films 48 have been formed (see FIG. 9B). The conductor plug 50a is connected to the gate conductor 20 at the boundary between the PMOS transistor formation region 2 and the NMOS transistor formation region 4. The conductor plug 50b is connected to the source/drain electrode 32 of the PMOS transistor 34. The conductor plug 50c is connected to the source/drain electrode 32 of the NMOS transistor 36.

Figure 10:
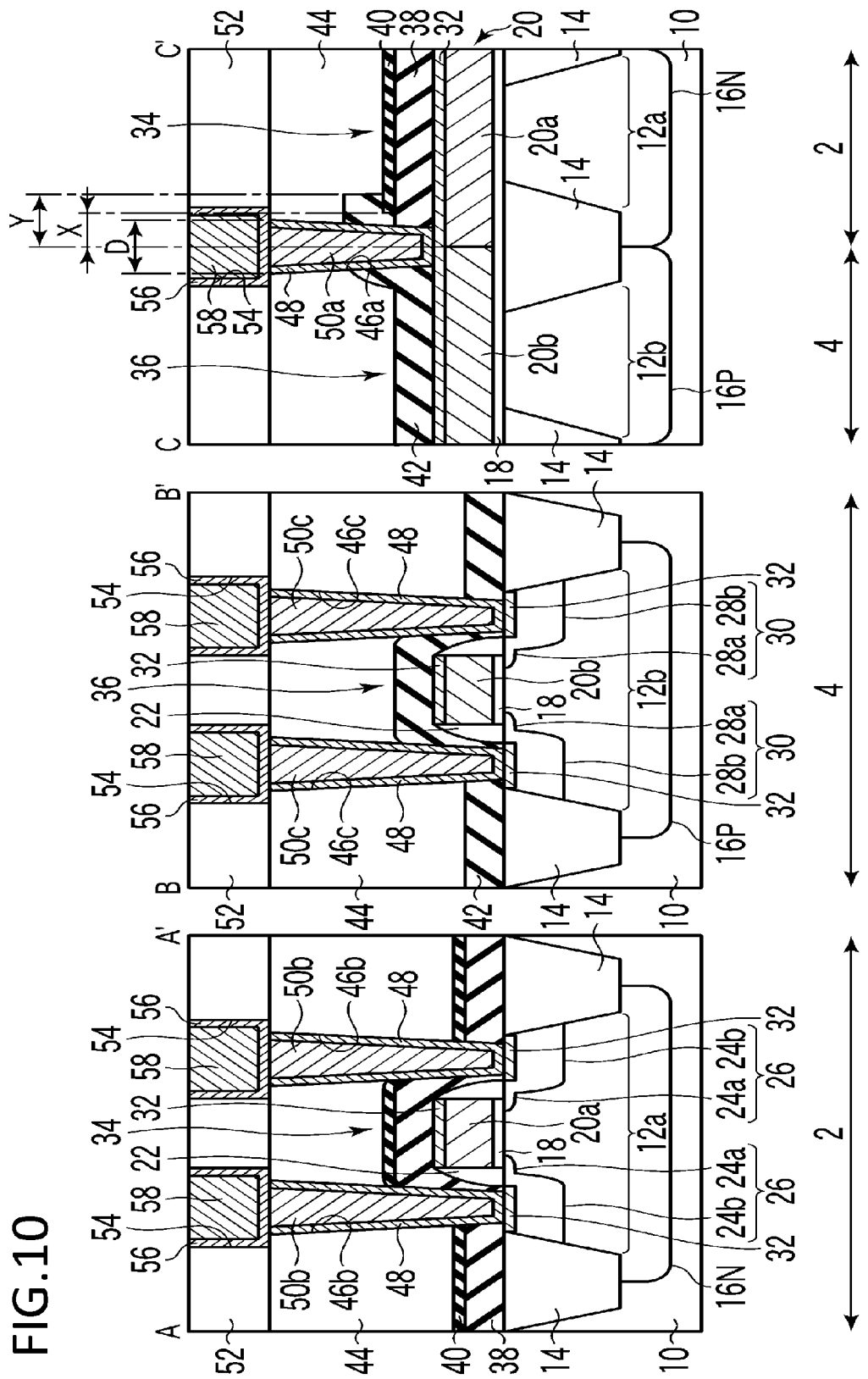
FIG. 10 provides process cross-sectional views of the semiconductor device, further illustrating the semiconductor device fabrication method according to the embodiment.

Then, an interlayer insulating film 52 is formed on the entire surface by CVD, for example (see FIG. 10). The interlayer insulating film 52 may be a silicon oxide film, for example, formed to a thickness in the range of 100 to 200 nm, for example.

Photolithography is used to form trenches 54 in which interconnects 58 are to be embedded in the interlayer insulating film 52. The top surface of the conductor plugs 50a to 50c are exposed at the bottom of the trenches 54.

Then, a barrier metal film 56 is formed on the entire surface by sputtering, for example. The barrier metal film 56 may be a Ta film, for example.

Then, a seed layer (not shown) is formed on the entire surface by sputtering, for example. The seed layer will be used when a conducting film is formed by electroplating in the subsequent stage. A Cu film, for example, may be formed as the seed layer to a thickness in the range of approximately 1 to 10 nm, for example.

Then, a conducting film is formed on the entire surface by electroplating, for example. A Cu film, for example, may be formed as the conducting film to a thickness in the range of 50 to 400 nm, for example.

Then, the conducting film, the seed layer and the barrier metal film 56 are polished by CMP, for example, to expose the surface of the interlayer insulating film 52. As a result, the interconnects 58 made of the conducting films are embedded in the trenches 54 in which the barrier metal film 56 has been formed.

Thus, a semiconductor device according to the present embodiment has been fabricated.

As has been described, according to the present embodiment, during etching of the etch stopper film 40 in the NMOS transistor formation region 4, a portion of the etch stopper film 40 in the PMOS transistor formation region 2 is also side-etched. Accordingly, the etch stopper film 40 does not obstruct etching for forming the contact hole 46a down to the gate conductor 20 in the region of the boundary between the PMOS transistor formation region 2 and the NMOS transistor formation region 4. That is, during formation of the contact hole 46b by etching, the etch stopper film 40 does not obstruct the etching of the interlayer insulating film 44 and the stress films 42 and 38. Consequently, according to the present embodiment, a good contact hole 46a may be formed and therefore the conductor plug 50a may be reliably connected to the gate conductor 20. Therefore, a reliable semiconductor device may be fabricated with a high manufacturing yield according to the present embodiment.

[Variations]

Various variations of the embodiment described above are possible.

For example, while the PMOS transistor 34 is formed in region 2 and the NMOS transistor 36 is formed in region 4, the NMOS transistor 36 may be formed in region 2 and the PMOS transistor 34 may be formed in region 4. In this case, preferably a tensile stress film is formed as the stress film 38 and a compressive stress film is formed as the stress film 42.

While the stress film 38 is a silicon nitride film in the embodiment described above, the stress film 38 is not limited to a silicon nitride film. Any film capable of applying a stress to the channel region of the transistor formed in region 2 may be formed as appropriate.

While the stress film 42 is a silicon nitride film in the embodiment described above, the stress film 42 is not limited to a silicon nitride film. Any film capable of applying a stress to the channel region of the transistor formed in region 4 may be formed as appropriate.

While the etch stopper film 40 is a silicon oxide film in the embodiment described above, the etch stopper film 40 is not limited to a silicon oxide film. Any film that has etch characteristics different from those of the stress films 42 and 38 may be used as the etch stopper film 40 as appropriate.

While appropriate dopants are introduced into the gate conductor 20 formed from a polysilicon film to form the gate electrodes 20a and 20b in the embodiment described above, the material of the gate conductor 20 is not limited to this. For example, the gate conductor 20 may be formed from a metal film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device fabrication method comprising:
    forming a gate conductor continuously in first region and second region of a semiconductor substrate;
    forming a first transistor including a first gate electrode which is a portion of the gate conductor in the first region;
    forming a second transistor including a second gate electrode which is another portion of the gate conductor in the second region;
    forming a first stress film having a first etch characteristics to cover the first transistor and second transistor;
    forming a first insulating film having a second etch characteristics different from the first etch characteristic to over the first stress film;
    forming a first mask layer covering the first region and exposes the second region;
    removing the first insulating film over the second region by using the first mask layer as a mask and etching the first insulating film under the first mask layer in the direction parallel to the surface of the semiconductor substrate by a first width from an edge of the first mask layer;
    removing the first stress film over the second region by using the first mask layer as a mask;
    forming a second stress film having a third etch characteristics different from the first etch characteristics to cover the second transistor, the first stress film and the first insulating film over the semiconductor substrate;
    forming a second mask layer over the second stress film, the second mask layer covering the second region, an edge of the second mask layer over the first region side being located over the first insulating film;
    etching the second stress film by using the second mask layer as a mask so that a portion of the second stress film overlaps a portion of the first stress film and a portion of the first insulating film;
    forming a second insulating film to cover the first insulating film, the second stress film and the first insulating film over the semiconductor substrate;
    forming a contact hole passing through the second insulating film, the second stress film, and the first stress film, a bottom of the contact hole reaching to the gate conductor at the boundary between the first region and the second region; and
    embedding a conductor plug in the contact hole,
    wherein the first width is wider than a width of a contact potion between a bottom of the conductor plug and the gate conductor at the boundary.

2. The semiconductor device fabrication method according to claim 1, wherein the first width is greater than the radius of the contact hole.

3. The semiconductor device fabrication method according to claim 1, wherein: the first transistor is one of a PMOS transistor and an NMOS transistor; and the second transistor is the other of the PMOS transistor and the NMOS transistor.

4. The semiconductor device fabrication method according to claim 1, wherein: the first stress film is one of a compressive stress film and a tensile stress film; and the second stress film is the other of the compressive stress film and the tensile stress film.

5. The semiconductor device fabrication method according to claim 1, wherein:
    the first stress film is a silicon nitride film; and
    the second stress film is another silicon nitride film.

6. The semiconductor device fabrication method according to claim 1, wherein the first insulating film is a silicon oxide film.

7. The semiconductor device fabrication method according to claim 1, wherein:
    in the etching the first insulating film by using the first mask layer as a mask,
    the first insulating film is etched by wet etching.

8. The semiconductor device fabrication method according to claim 1, wherein:
    in the etching of the first stress film by using the first mask layer as a mask,
    the second stress film is etched by dry etching.

9. A semiconductor device comprising:
    a gate conductor formed continuously in first region and second region of a semiconductor substrate;
    a first transistor formed in the first region and including a first gate electrode which is a portion of the gate conductor and a first source/drain diffusion layer formed in the semiconductor substrate on both sides of the first gate electrode;
    a second transistor formed in the second region and including a second gate electrode which is another portion of the gate conductor and a second source/drain diffusion layer formed in the semiconductor substrate on both sides of the second gate electrode;

a first stress film having a first etch characteristics formed to cover the first transistor on the semiconductor substrate in the first region;

a first insulating film having a second etch characteristics different from the first etch characteristics and being formed on a portion of the first region except a portion adjacent to the second region;

a second stress film formed to cover the second transistor on the semiconductor substrate in the second region, the edge of the second stress film on the first region side overlapping a portion of the first stress film and a portion of the first insulating film;

a second insulating film formed to cover the first stress film, the second stress film and the first insulating film on the semiconductor substrate; and a conductor plug embedded in a contact hole passing through the second insulating film, the second stress film and the first stress film, a bottom of the contact hole reaching to the gate conductor at the boundary between the first and second regions;

wherein the edge of the first insulating film on the second region side is a distance from the contact hole, and the distance is larger than a width of a contact potion between a bottom of the conductor plug and the gate conductor at the boundary.

10. The semiconductor device according to claim 9, wherein:
the first transistor is one of a PMOS transistor and an NMOS transistor; and
the second transistor is the other of the PMOS transistor and the NMOS transistor.

11. The semiconductor device according to claim 9, wherein:
the first stress film is one of a compressive stress film and a tensile stress film; and
the second stress film is the other of the compressive stress film and the tensile stress film.

12. The semiconductor device according to claim 9, wherein: the first stress film is a silicon nitride film; and the second stress film is another silicon nitride film.

13. The semiconductor device according to claim 9, wherein the first insulating film is a silicon oxide film.

* * * * *